US012564073B2

(12) United States Patent
Ishimatsu et al.

(10) Patent No.: US 12,564,073 B2
(45) Date of Patent: Feb. 24, 2026

(54) CONTROL CHIP FOR LEADFRAME PACKAGE

(71) Applicant: ROHM CO., LTD., Kyoto (JP)

(72) Inventors: Yuji Ishimatsu, Kyoto (JP); Kenji Hama, Kyoto (JP); Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 582 days.

(21) Appl. No.: 17/913,527

(22) PCT Filed: Mar. 22, 2021

(86) PCT No.: PCT/JP2021/011712
§ 371 (c)(1),
(2) Date: Sep. 22, 2022

(87) PCT Pub. No.: WO2021/200337
PCT Pub. Date: Oct. 7, 2021

(65) Prior Publication Data
US 2023/0109471 A1        Apr. 6, 2023

(30) Foreign Application Priority Data
Apr. 1, 2020    (JP) ................................ 2020-065761

(51) Int. Cl.
*H01L 23/495*        (2006.01)
*H01L 23/00*        (2006.01)
(52) U.S. Cl.
CPC .. *H01L 23/49531* (2013.01); *H01L 23/49503* (2013.01); *H01L 23/49513* (2013.01);
(Continued)

(58) Field of Classification Search
CPC ......... H01L 23/49531; H01L 23/49513; H01L 23/49555; H01L 23/4952; H01L 23/49503;
(Continued)

(56) References Cited

U.S. PATENT DOCUMENTS 11,437,354 B2 *   9/2022   Ishimatsu ............... H01L 24/48
11,894,321 B2 *   2/2024   Osumi .................... B60L 50/60
(Continued)

FOREIGN PATENT DOCUMENTS

CN        102931182 A        2/2013
JP        2020-4893 A        1/2020

OTHER PUBLICATIONS

Office Action received in the corresponding German Patent application, Jan. 9, 2024, and machine translation (13 pages).
(Continued)

*Primary Examiner* — Alonzo Chambliss
(74) *Attorney, Agent, or Firm* — HSML P.C.

(57) ABSTRACT

An electronic device includes: an insulating substrate including an obverse surface facing a thickness direction; a wiring portion formed on the substrate obverse surface and made of a conductive material; a lead frame arranged on the substrate obverse surface; a first and a second semiconductor elements electrically connected to the lead frame; and a first control unit electrically connected to the wiring portion to operate the first semiconductor element as a first upper arm and operate the second semiconductor element as a first lower arm. The lead frame includes a first pad portion to which the first semiconductor element is joined and a second pad portion to which the second semiconductor element is joined. The first and second pad portions are spaced apart from the wiring portion and arranged in a first direction with a first separation region sandwiched therebetween, where
(Continued)

the first direction is orthogonal to the thickness direction. The first control unit is spaced apart from the lead frame as viewed in the thickness direction, while overlapping with the first separation region as viewed in a second direction orthogonal to the thickness direction and the first direction.

21 Claims, 22 Drawing Sheets

(52) U.S. Cl.
CPC .... *H01L 23/4952* (2013.01); *H01L 23/49555* (2013.01); *H01L 23/49562* (2013.01); *H01L 23/49575* (2013.01); *H01L 24/46* (2013.01); *H01L 2224/48137* (2013.01); *H01L 2224/73265* (2013.01); *H01L 2924/181* (2013.01)

(58) Field of Classification Search
CPC ..... H01L 2924/181; H01L 2224/73265; H01L 24/46; H01L 23/49562; H01L 2224/48137
See application file for complete search history.

(56) References Cited

U.S. PATENT DOCUMENTS

| | | | | |
|---|---|---|---|---|
| 11,916,000 | B2 * | 2/2024 | Matsubara | H01L 24/48 |
| 2001/0048148 | A1 * | 12/2001 | Koyama | H01L 24/49 |
| | | | | 257/E23.044 |
| 2009/0129038 | A1 * | 5/2009 | Takakusaki | H01L 25/16 |
| | | | | 361/772 |
| 2010/0019391 | A1 * | 1/2010 | Strzalkowski | H01L 23/495 |
| | | | | 257/777 |
| 2013/0062745 | A1 * | 3/2013 | Kimura | H01L 23/49575 |
| | | | | 257/E23.116 |
| 2014/0306332 | A1 * | 10/2014 | Denison | H01L 24/84 |
| | | | | 257/676 |
| 2017/0236812 | A1 | 8/2017 | Ikeda et al. | |
| 2023/0178461 | A1 * | 6/2023 | Hama | H01L 24/32 |
| | | | | 257/666 |

OTHER PUBLICATIONS

1 International Search Report issued in PCT/JP2021/011712, Jun. 22, 2021 (2 pages).

* cited by examiner

CONTROL CHIP FOR LEADFRAME PACKAGE

TECHNICAL FIELD

The present disclosure relates to an electronic device.

BACKGROUND ART

An electronic device called IPM (Intelligent Power Module) is one of various electronic devices. Such an electronic device includes a semiconductor element, a control element, and a lead frame (see Patent Document 1). The semiconductor element is a power semiconductor element that controls power. The control element controls driving of the semiconductor element. The lead frame supports the semiconductor element and the control element and serves as a conduction path for these elements.

PRIOR ART DOCUMENTS

Patent Document

Patent Document 1: JP-A-2020-4893

SUMMARY OF THE INVENTION

Problem to be Solved by the Invention

As the number of control signals that are input to or output from the control element increases with an increase in the integration density of the electronic device, the number of conduction paths to the control element needs to be increased. However, when these conduction paths are formed using metal lead frames as in conventional cases, a further increase in the integration density of the electronic device may be difficult. For example, the lead frames are processed through pressing performed using a mold or etching, for example, and therefore, it is difficult to make the conduction paths thin or increase the density of the conduction paths, and this is a factor that inhibits an increase in the integration density.

In view of the foregoing, the present disclosure has an object of providing an electronic device that enables a further increase in the integration density.

Means for Solving the Problem

An electronic device provided according to the present disclosure includes: an insulating substrate including a substrate obverse surface that faces one side in a thickness direction; a wiring portion that is formed on the substrate obverse surface and made of a conductive material; a lead frame that is arranged on the substrate obverse surface; a first semiconductor element and a second semiconductor element that are electrically connected to the lead frame; and a first control unit that is electrically connected to the wiring portion and causes the first semiconductor element to operate as a first upper arm and causes the second semiconductor element to operate as a first lower arm. The lead frame includes a first pad portion to which the first semiconductor element is joined and a second pad portion to which the second semiconductor element is joined. The first pad portion and the second pad portion are spaced apart from the wiring portion and are arranged in a first direction with a first separation region sandwiched between the first pad portion and the second pad portion, where the first direction is orthogonal to the thickness direction. The first control unit is spaced apart from the lead frame as viewed in the thickness direction and overlaps with the first separation region as viewed in a second direction that is orthogonal to the thickness direction and the first direction.

Advantages of the Invention

According to the electronic device of the present disclosure, it is possible to further increase the integration density.

MODE FOR CARRYING OUT THE INVENTION

Figure 1:
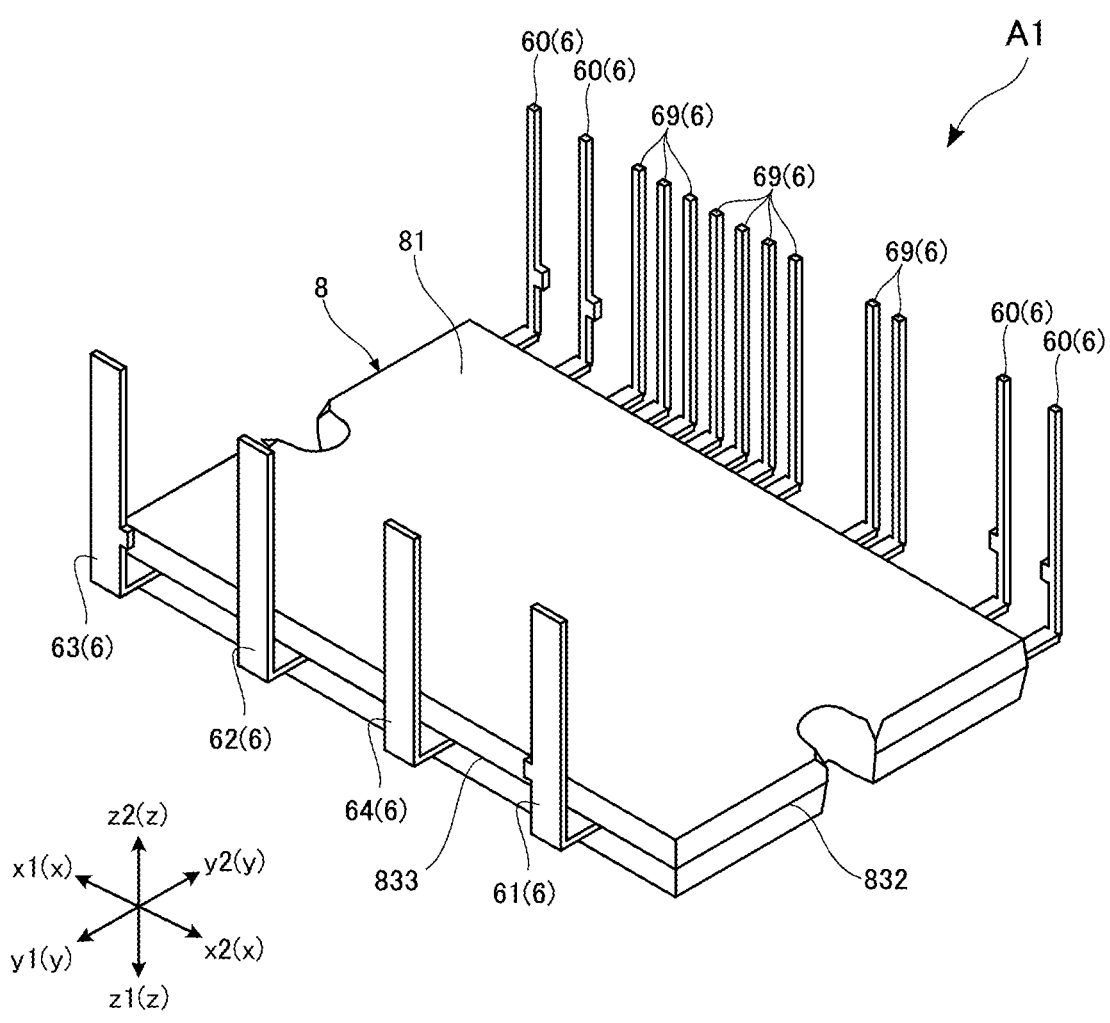
FIG. 1 is a perspective view showing an electronic device according to a first embodiment.

Preferred embodiments of an electronic device according to the present disclosure will be described below with reference to the drawings. In the following description, the same or similar constitutional elements are denoted with the same reference numerals, and redundant descriptions of which are omitted. In the present disclosure, terms such as "first", "second", "third", etc., are used simply as labels, and are not necessarily intended to give an order to matter described using these terms.

FIGS. 1 to 9 show an electronic device A1 according to a first embodiment. The electronic device A1 includes an insulating substrate 1, wiring portions 2, two semiconductor elements 31 and 32, a control unit 41, a plurality of passive elements 5, lead frames 6, a plurality of connecting members 71 to 74, and a resin member 8. The control unit 41 includes two control elements 4a and 4b. The lead frames 6 include a plurality of leads 61 to 64, 69, and 60. The electronic device A1 is an IPM (Intelligent Power Module), for example, and is used in an air conditioner, a motor control device, or the like. The electronic device A1 is not limited to the IPM.

Figure 2:
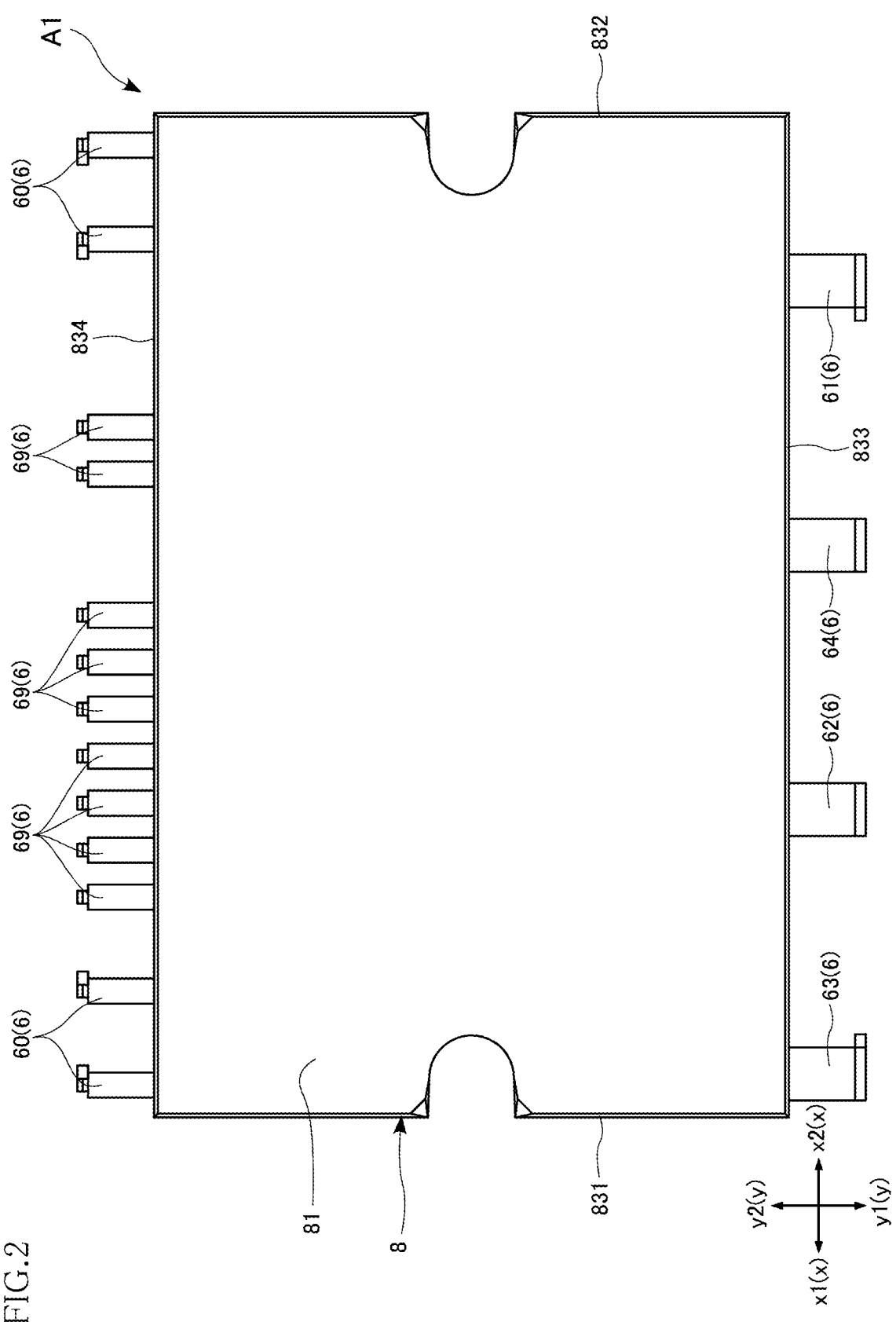
FIG. 2 is a plan view showing the electronic device according to the first embodiment.
Figure 3:
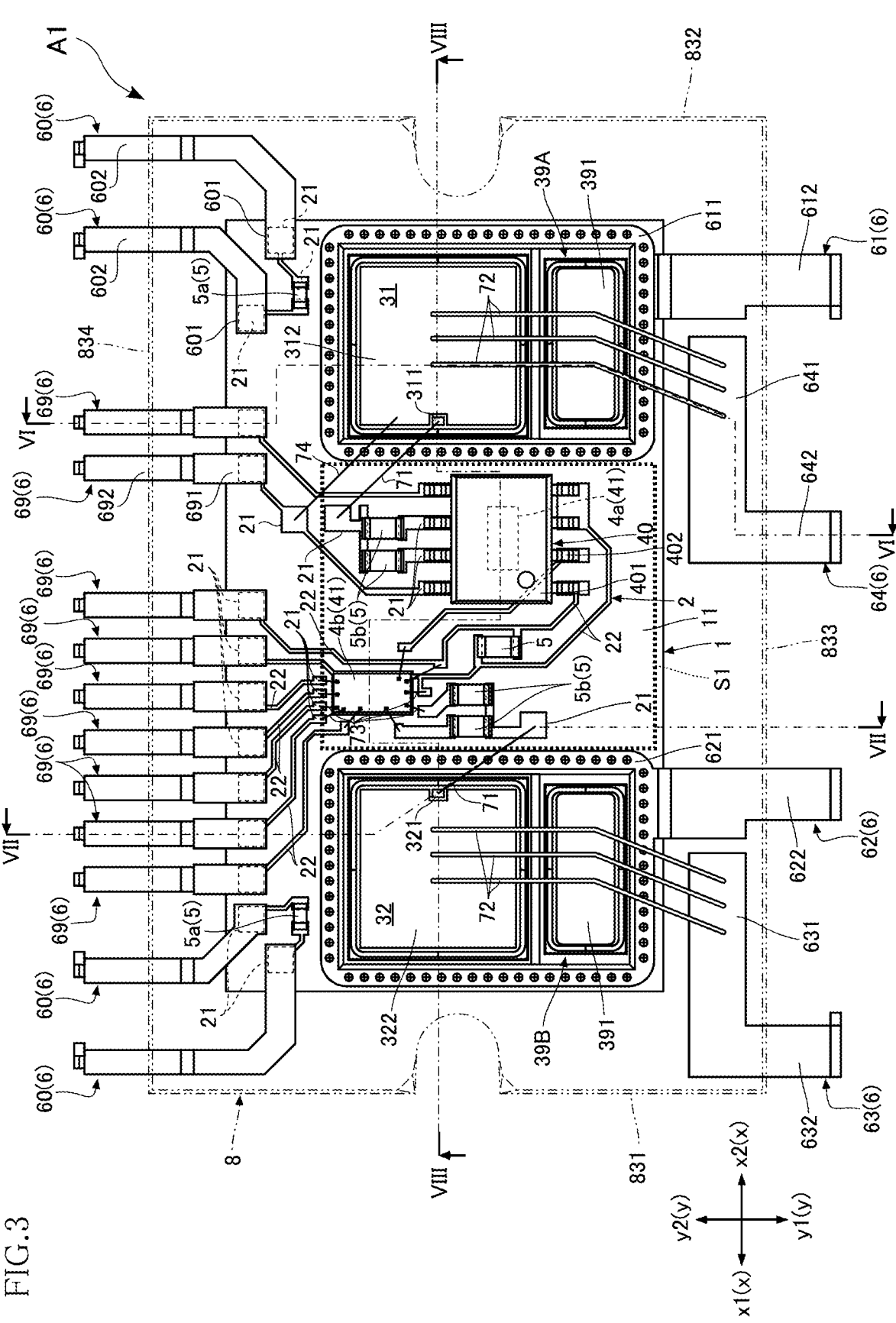
FIG. 3 is a diagram corresponding to the plan view of FIG. 2, in which a resin member is shown using an imaginary line.
Figure 4:
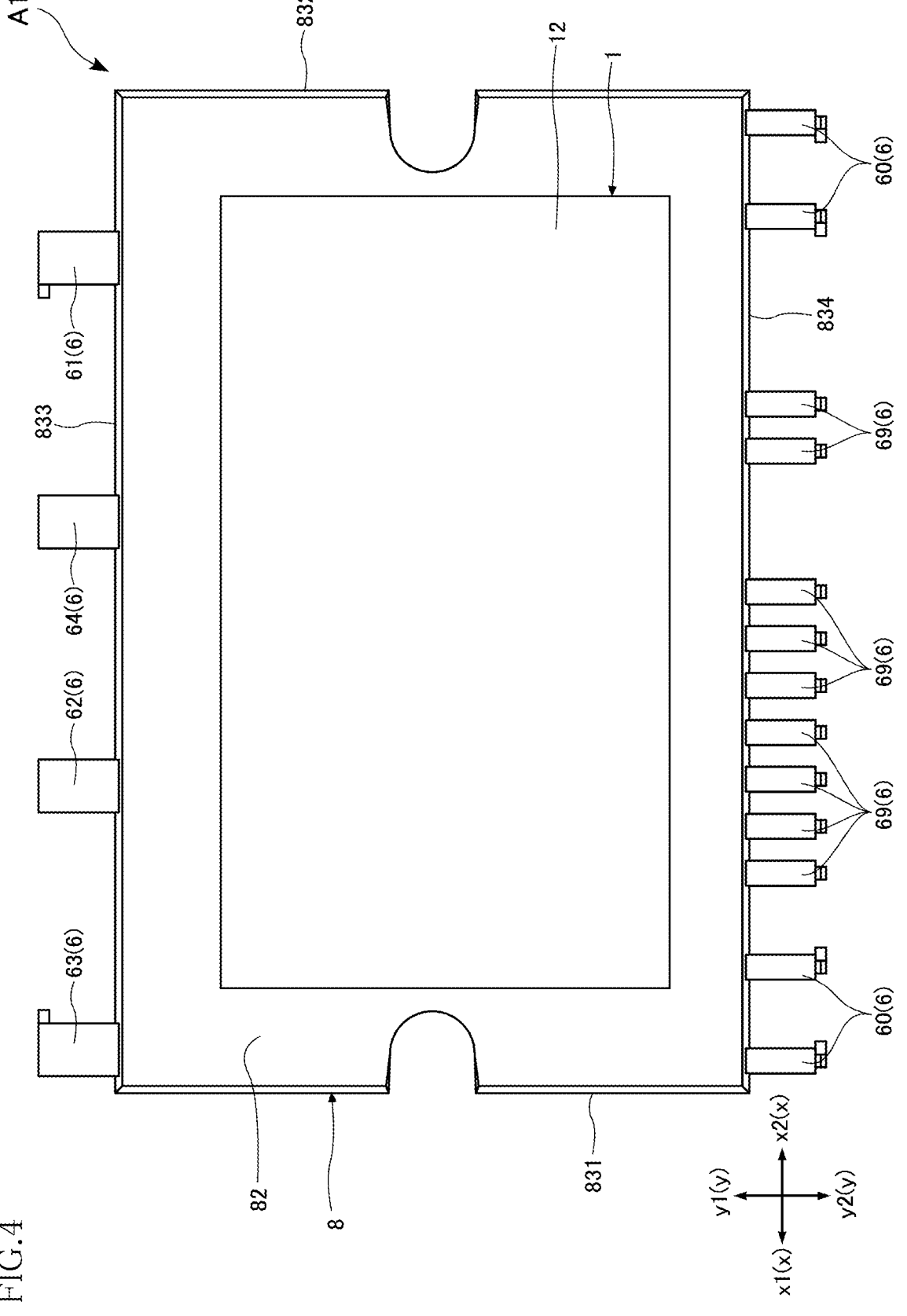
FIG. 4 is a bottom view showing the electronic device according to the first embodiment.
Figure 5:
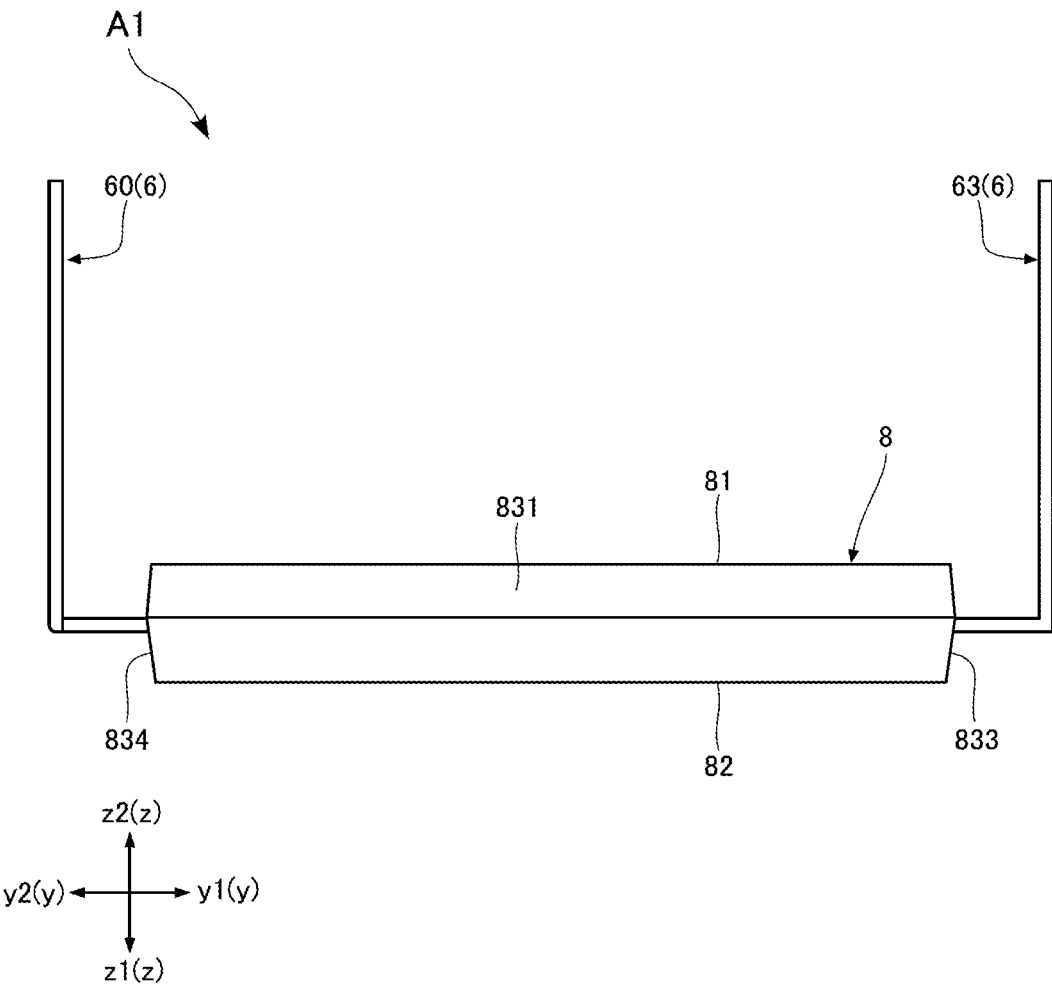
FIG. 5 is a side view (left side view) showing the electronic device according to the first embodiment.
Figure 6:
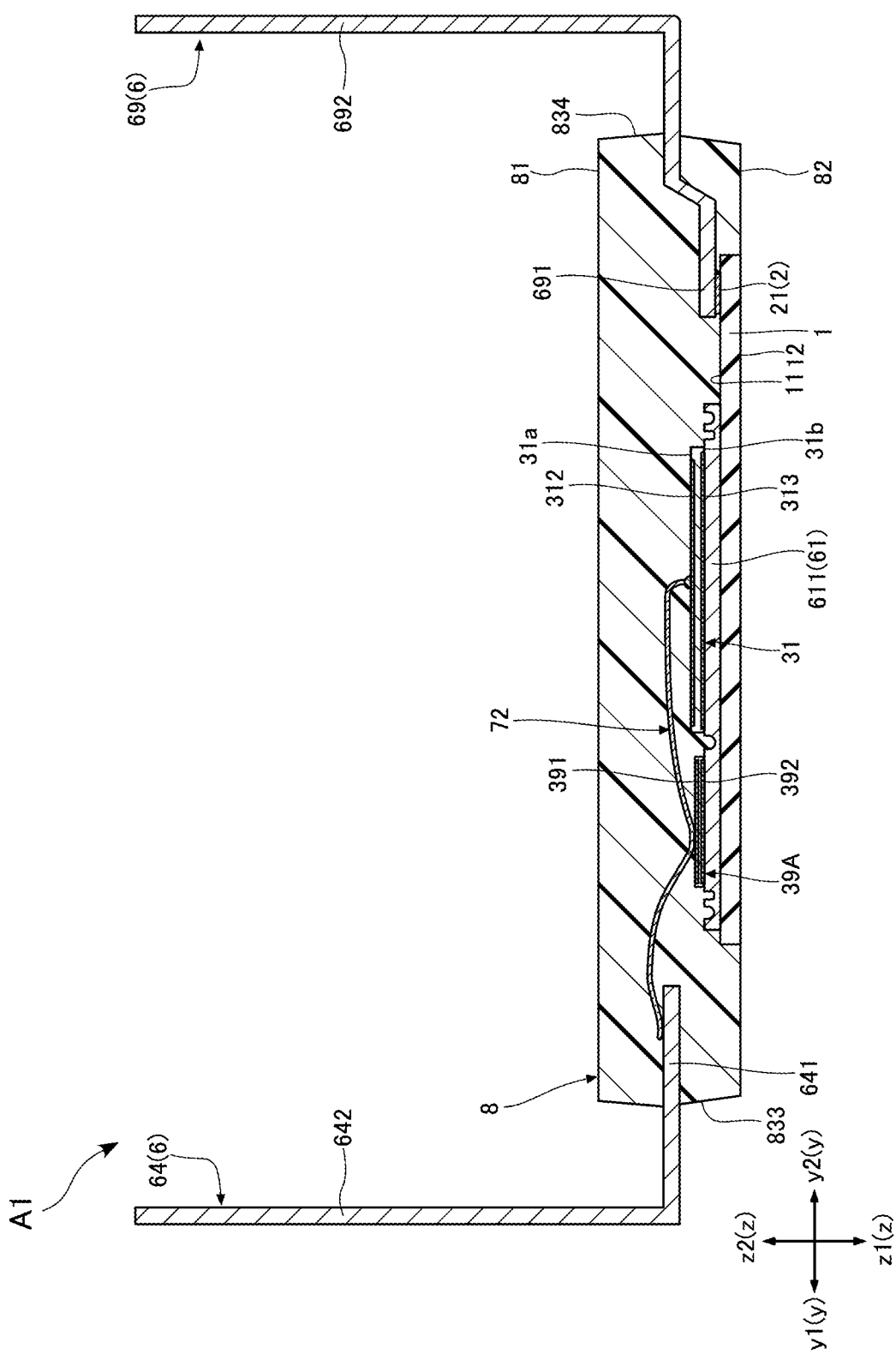
FIG. 6 is a cross-sectional view taken along line VI-VI in FIG. 3.
Figure 7:
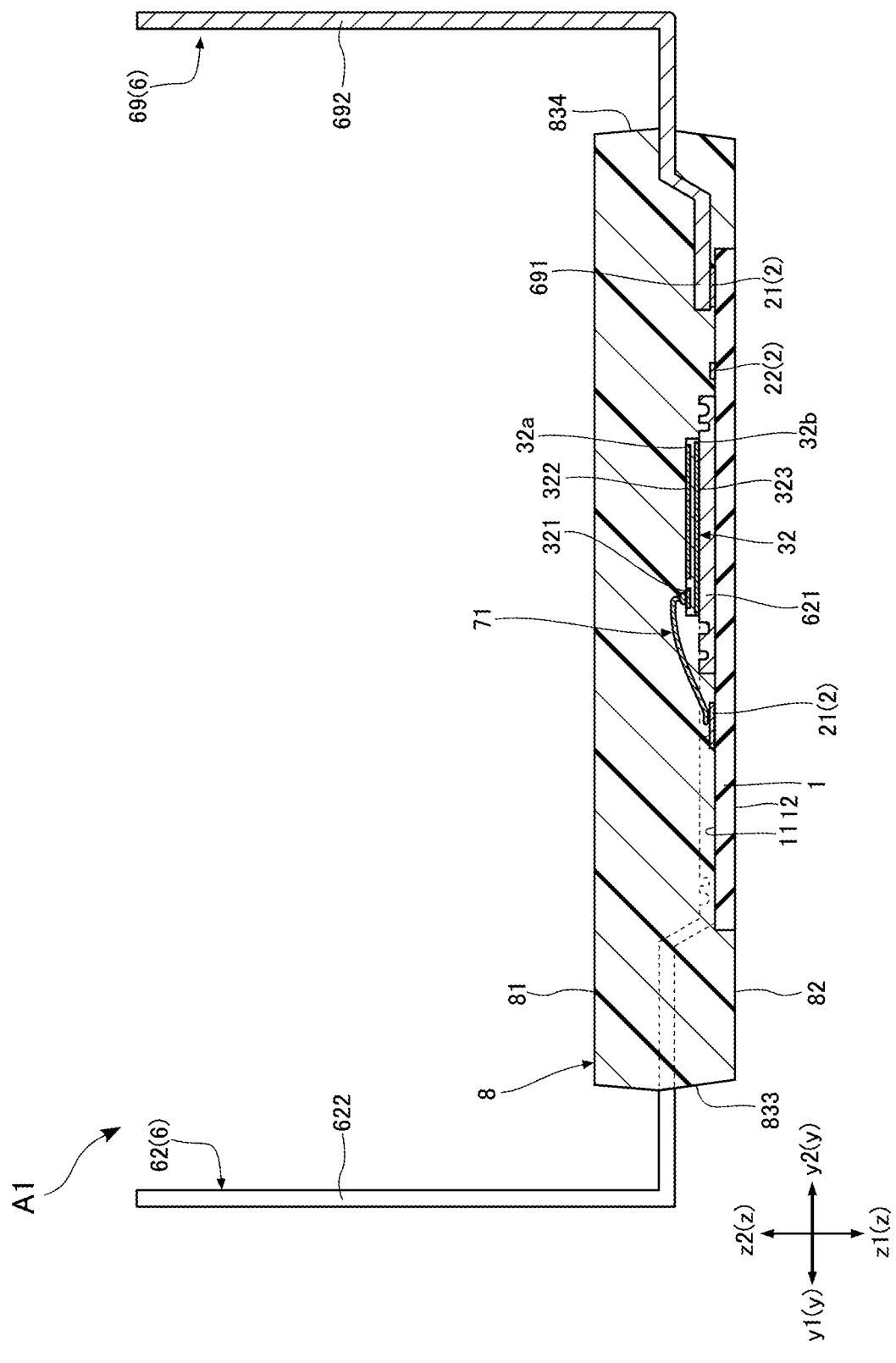
FIG. 7 is a cross-sectional view taken along line VII-VII in FIG. 3.
Figure 8:
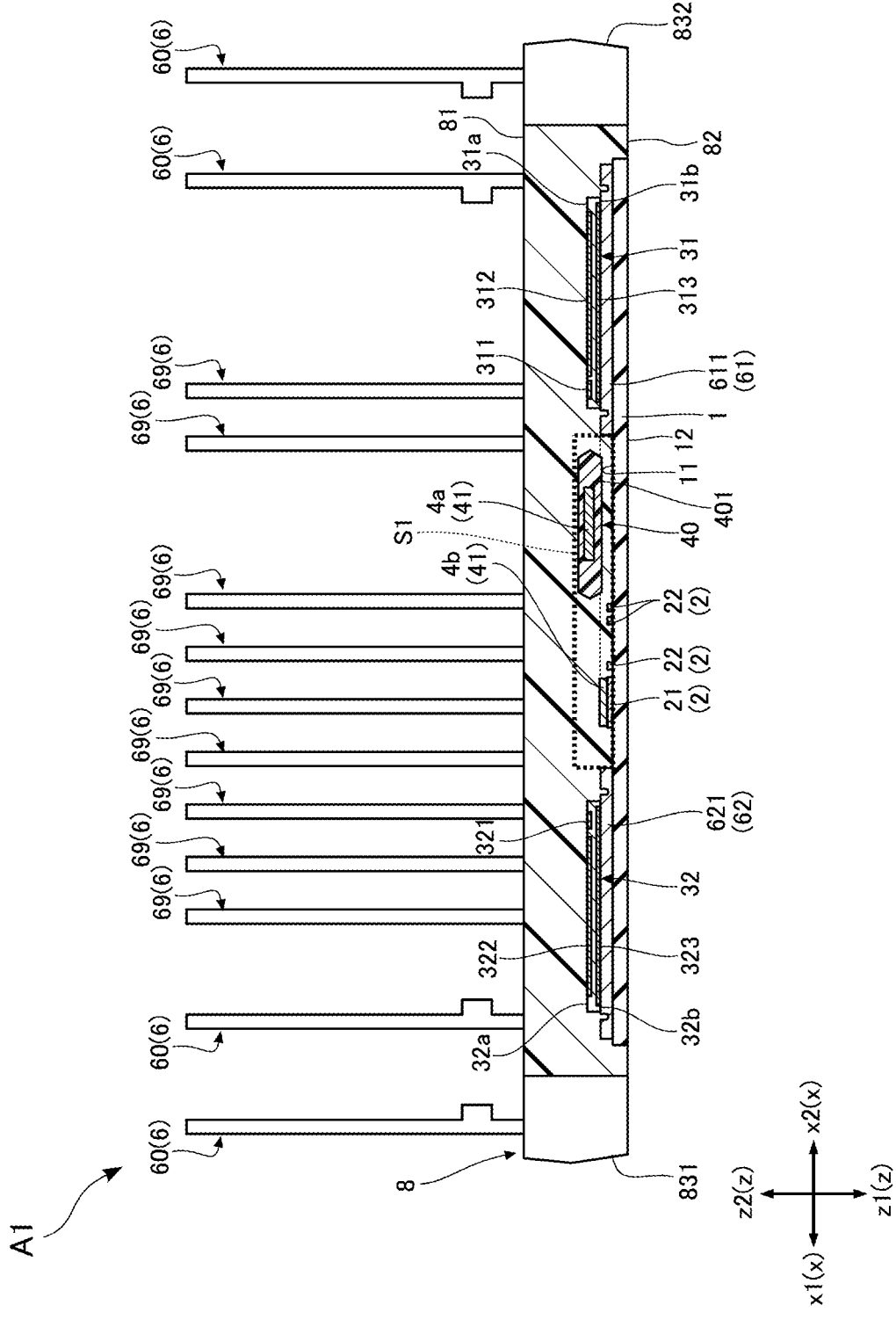
FIG. 8 is a cross-sectional view taken along line VIII-VIII in FIG. 3.
Figure 9:
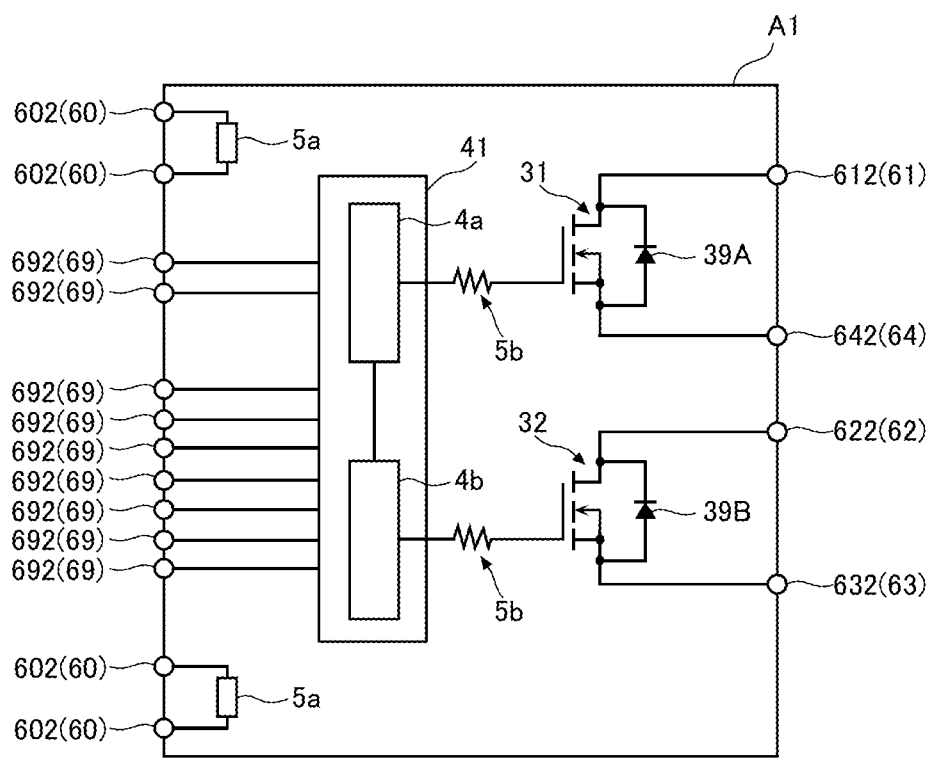
FIG. 9 is an example of a circuit diagram of the electronic device according to the first embodiment.

FIG. 1 is a perspective view showing the electronic device A1. FIG. 2 is a plan view showing the electronic device A1. FIG. 3 is a diagram corresponding to the plan view of FIG. 2, in which the resin member 8 is shown using an imaginary line (two-dot chain line). FIG. 4 is a bottom view showing the electronic device A1. FIG. 5 is a side view (left side view) showing the electronic device A1. FIG. 6 is a cross-sectional view taken along line VI-VI in FIG. 3. FIG. 7 is a cross-sectional view taken along line VII-VII in FIG. 3. FIG. 8 is a cross-sectional view taken along line VIII-VIII in FIG. 3. In FIG. 8, the connecting members 71 and 72 are omitted. FIG. 9 is a circuit diagram showing a circuit configuration of the electronic device A1.

For the sake of convenience of description, three mutually orthogonal directions in FIGS. 1 to 8 are defined as an x direction, a y direction, and a z direction. The z direction is a thickness direction of the electronic device A1. The x direction is a left-right direction in a plan view (see FIGS. 2 and 3) of the electronic device A1. The y direction is an up-down direction in a plan view (see FIGS. 2 and 3) of the electronic device A1. One of the x direction will be referred to as an x1 direction, and the other of the x direction will be referred to as an x2 direction. Similarly, one of the y direction will be referred to as a y1 direction, the other of the y direction will be referred to as a y2 direction, one of the z direction will be referred to as a z1 direction, and the other of the z direction will be referred to as a z2 direction. In the following description, "plan view" refers to a view in the z direction. The x direction is an example of a "first direction", and the y direction is an example of a "second direction".

The insulating substrate 1 has a plate-like shape. The shape of the insulating substrate 1 in a plan view is not particularly limited, but is, for example, a rectangular shape that is elongated in the x direction. The thickness (length in the z direction) of the insulating substrate 1 is not particularly limited, but is, for example, at least 0.1 mm and not larger than 1.0 mm. The insulating substrate 1 is made of a material that has an insulating property. The material of the insulating substrate 1 is preferably a material that has a higher heat conductivity than the resin member 8, for example. For example, a ceramic material such as alumina ($Al_2O_3$), silicon nitride (SiN), aluminum nitride (AlN), or zirconia-containing alumina is used as the material of the insulating substrate 1.

As shown in FIGS. 6 to 8, the insulating substrate 1 includes a substrate obverse surface 11 and a substrate reverse surface 12. The substrate obverse surface 11 and the substrate reverse surface 12 are spaced apart from each other in the z direction. The substrate obverse surface 11 faces the z2 direction, and the substrate reverse surface 12 faces the z1 direction. Each of the substrate obverse surface 11 and the substrate reverse surface 12 is a flat surface that is orthogonal to the z direction. The wiring portions 2 are formed on the substrate obverse surface 11, and the lead frames 6 and a plurality of electronic components are mounted on the substrate obverse surface 11. The plurality of electronic components include the two semiconductor elements 31 and 32 and the control unit 41 (control elements 4a and 4b). The substrate reverse surface 12 is exposed from the resin member 8. The substrate reverse surface 12 may be covered by the resin member 8.

The wiring portions 2 are formed on the substrate obverse surface 11 as shown in FIG. 3. The wiring portions 2 are made of a conductive material. For example, silver (Ag) or an Ag alloy (e.g., Ag—Pt or AgPd) is used as a constituent material of the wiring portions 2. Instead of Ag or an Ag alloy, copper (Cu), a Cu alloy, gold (Au), an Au alloy, or the like may be used as the constituent material. The wiring portions 2 are formed by printing a paste material that contains the above-described constituent material, and then firing the paste material. The method for forming the wiring portions 2 is not limited to this method, and can be changed as appropriate according to the constituent material that is used. The wiring portions 2 are conduction paths to the control unit 41. Various control signals for controlling the semiconductor elements 31 and 32 pass through the wiring portions 2. These control signals include driving signals, detection signals, and the like. The driving signals are signals for controlling driving of the semiconductor elements 31 and 32. The detection signals are signals for detecting operation states (e.g., a voltage value, a current value, etc.,) of the semiconductor elements 31 and 32. Also, operating power of the control unit 41 is transmitted to the wiring portions 2.

The wiring portions 2 include a plurality of pad portions 21 and a plurality of connection wires 22 as shown in FIG. 3. The shape of each of the plurality of pad portions 21 in a plan view is not particularly limited, but is, for example, a rectangular shape. The shape of each pad portion 21 in a plan view may be a circular shape, an elliptical shape, or a polygonal shape, for example. The plurality of pad portions 21 are spaced apart from each other. The plurality of pad portions 21 are portions to which other constitutional components are joined as appropriate. In the electronic device A1, the control unit 41 (control elements 4a and 4b), the plurality of passive elements 5, the plurality of leads 69 and 60, and the plurality of connecting members 71, 73, and 74 are joined to the plurality of pad portions 21. The plurality of connection wires 22 connect the plurality of pad portions 21 to each other such that the conduction paths of the electronic device A1 form a circuit configuration shown in FIG. 9, for example. Arrangement and shapes of the plurality of pad portions 21 and the plurality of connection wires 22 in the wiring portions 2 are not limited to those in the illustrated example.

Each of the two semiconductor elements 31 and 32 is a power transistor that controls power, for example. Each of the semiconductor elements 31 and 32 is a MOSFET (Metal-Oxide-Semiconductor Field-Effect Transistor) that is constituted by a SiC (silicon carbide) substrate, for example. Note that each of the semiconductor elements 31 and 32 may be a MOSFET constituted by an Si substrate, instead of the SiC substrate, and may include an IGBT element, for example. Also, each of the semiconductor elements may be a MOSFET that contains GaN (gallium nitride). As shown in FIGS. 3 and 8, the semiconductor element 31 is arranged on the lead 61 (pad portion 611, which will be described later) and the semiconductor element 32 is arranged on the lead 62 (pad portion 621, which will be described later). Each of the semiconductor elements 31 and 32 overlaps with the insulating substrate 1 and the lead frames 6, but is spaced apart from the wiring portions 2, in a plan view as shown in FIG. 3. The two semiconductor elements 31 and 32 are arranged in the x direction. The semiconductor element 31 is an example of a "first semiconductor element", and the semiconductor element 32 is an example of a "second semiconductor element".

The semiconductor element 31 includes an element obverse surface 31*a* (first element obverse surface) and an element reverse surface 31*b* (first element reverse surface) as shown in FIGS. 6 and 8. The element obverse surface 31*a* and the element reverse surface 31*b* are spaced apart from each other in the z direction. The element obverse surface 31*a* faces the z2 direction, and the element reverse surface 31*b* faces the z1 direction. Each of the element obverse surface 31*a* and the element reverse surface 31*b* is flat. The element obverse surface 31*a* and the element reverse surface 31*b* are substantially orthogonal to the z direction.

As shown in FIGS. 3, 6, and 8, the semiconductor element 31 includes a control electrode 311 (first control electrode), a obverse surface electrode 312 (first obverse surface electrode), and a reverse surface electrode 313 (first reverse surface electrode). The control electrode 311 and the obverse surface electrode 312 are formed on the element obverse surface 31*a*. The control electrode 311 and the obverse surface electrode 312 are spaced apart from each other and insulated from each other. As shown in FIG. 3, the obverse surface electrode 312 is larger than the control electrode 311 in a plan view. A connecting member 71 is joined to the control electrode 311. A plurality of connecting members 72 are joined to the obverse surface electrode 312. The reverse surface electrode 313 is formed on the element reverse surface 31*b*. The reverse surface electrode 313 spreads over substantially the entire element reverse surface 31*b*. The reverse surface electrode 313 is joined to the lead 61 (pad portion 611, which will be described later). In an example in which the semiconductor element 31 is constituted by a MOSFET, the control electrode 311 is, for example, a gate electrode, the obverse surface electrode 312 is, for example, a source electrode, and the reverse surface electrode 313 is, for example, a drain electrode.

The semiconductor element 32 includes an element obverse surface 32*a* (second element obverse surface) and an element reverse surface 32*b* (second element reverse surface) as shown in FIGS. 7 and 8. The element obverse surface 32*a* and the element reverse surface 32*b* are spaced apart from each other in the z direction. The element obverse surface 32*a* faces the z2 direction, and the element reverse surface 32*b* faces the z1 direction. Each of the element obverse surface 32*a* and the element reverse surface 32*b* is flat. The element obverse surface 32*a* and the element reverse surface 32*b* are substantially orthogonal to the z direction.

As shown in FIGS. 3, 7, and 8, the semiconductor element 32 includes a control electrode 321 (second control electrode), a obverse surface electrode 322 (second obverse surface electrode), and a reverse surface electrode 323 (second reverse surface electrode). The control electrode 321 and the obverse surface electrode 322 are formed on the element obverse surface 32*a*. The control electrode 321 and the obverse surface electrode 322 are spaced apart from each other and insulated from each other. As shown in FIG. 3, the obverse surface electrode 322 is larger than the control electrode 321 in a plan view. A connecting member 71 is joined to the control electrode 321. A plurality of connecting members 72 are joined to the obverse surface electrode 322. The reverse surface electrode 323 is formed on the element reverse surface 32*b*. The reverse surface electrode 323 spreads over substantially the entire element reverse surface 32*b*. The reverse surface electrode 323 is joined to the lead 62 (pad portion 621, which will be described later). In an example in which the semiconductor element 32 is constituted by a MOSFET, the control electrode 321 is, for example, a gate electrode, the obverse surface electrode 322 is, for example, a source electrode, and the reverse surface electrode 323 is, for example, a drain electrode.

A first driving signal is input from the control unit 41 (control element 4*a*) to the control electrode 311 (gate electrode) of the semiconductor element 31, and a conducting state and an interrupting state are switched according to the input first driving signal. An operation through which the conducting state and the interrupting state are switched is referred to as a switching operation. When the semiconductor element 31 is in the conducting state, a current flows from the reverse surface electrode 313 (drain electrode) to the obverse surface electrode 312 (source electrode), and when the semiconductor element 31 is in the interrupting state, the current does not flow.

A second driving signal is input from the control unit 41 (control element 4*b*) to the control electrode 321 (gate electrode) of the semiconductor element 32, and a conducting state and an interrupting state are switched according to the input second driving signal. When the semiconductor element 32 is in the conducting state, a current flows from the reverse surface electrode 323 (drain electrode) to the obverse surface electrode 322 (source electrode), and when the semiconductor element 32 is in the interrupting state, the current does not flow.

Two protective elements 39A and 39B are for preventing reverse voltage being applied to the semiconductor elements 31 and 32, respectively. As shown in FIGS. 3 and 6, the protective element 39A is arranged on the lead 61 (pad portion 611, which will be described later) together with the semiconductor element 31. As shown in FIG. 3, the protective element 39B is arranged on the lead 62 (pad portion 621) together with the semiconductor element 32. For example, diodes are used as the protective elements 39A and 39B as shown in FIG. 9. As shown in FIG. 9, the protective element 39A is connected in antiparallel with the semiconductor element 31, and the protective element 39B is connected in antiparallel with the semiconductor element 32.

Each of the two protective elements 39A and 39B includes an obverse surface electrode 391 and a reverse surface electrode 392 as shown in FIG. 6. The obverse surface electrode 391 is formed on the obverse surface (surface that faces the z2 direction) of each of the protective elements 39A and 39B. The reverse surface electrode 392 is formed on the reverse surface (surface that faces the z1 direction) of each of the protective elements 39A and 39B. In each of the protective elements 39A and 39B, a plurality of connecting members 72 are joined to the obverse surface electrode 391. The obverse surface electrode 391 of the protective element 39A and the obverse surface electrode 312 of the semiconductor element 31 are electrically connected to each other via the plurality of connecting members 72. The obverse surface electrode 391 of the protective element 39B and the obverse surface electrode 322 of the semiconductor element 32 are electrically connected to each other via the plurality of connecting members 72. The reverse surface electrode 392 of the protective element 39A is joined to the lead 61 and is electrically connected to the reverse surface electrode 313 of the semiconductor element 31 via the lead 61. Also, the reverse surface electrode 392 of the protective element 39B is joined to the lead 62 and is electrically connected to the reverse surface electrode 323 of the semiconductor element 32 via the lead 62. In an example in which the protective elements 39A and 39B are constituted by diodes, the obverse surface electrode 391 is an anode electrode, and the reverse surface electrode 392 is a cathode electrode. The electronic device A1 does not necessarily have to include the two protective elements 39A and 39B.

The control unit 41 controls driving of the semiconductor elements 31 and 32. The control unit 41 causes the semiconductor element 31 to operate as an upper arm (first upper arm) and causes the semiconductor element 32 to operate as a lower arm (first lower arm). The control unit 41 is arranged on the substrate obverse surface 11. As shown in FIG. 3, in a plan view, the control unit 41 does not overlap with the lead frames 6 and is spaced apart from the lead frames 6. The control unit 41 includes the control element 4a (first control element) and the control element 4b (second control element). The control unit 41 is an example of a "first control unit".

The control element 4a controls driving of the semiconductor element 31. Specifically, the control element 4a controls a switching operation of the semiconductor element 31 by inputting the first driving signal (e.g., gate voltage) to the control electrode 311 (gate electrode) of the semiconductor element 31. The control element 4a generates the first driving signal for causing the semiconductor element 31 to operate as the upper arm. In the present embodiment, the control element 4a constitutes a control device 40 together with a resin package 401 and a plurality of connection terminals 402. The control device 40 is an SOP (Small Outline Package) type package, for example. The package type of the control device 40 is not limited to the SOP type, and may be another package type such as a QFP (Quad Flat Package) type, an SOJ (Small Outline J-lead Package) type, a QFN (Quad Flatpack No Lead) type, or an SON (Small-Outline No Lead) type. The resin package 401 is made of epoxy resin, for example, and covers the control element 4a. The plurality of connection terminals 402 protrude from the resin package 401 and are electrically connected to the control element 4a inside the resin package 401. The connection terminals 402 of the control element 4a are joined and electrically connected to pad portions 21 (wiring portions 2) via a conductive joining material (e.g., solder, a metal paste, or a sintered metal, not shown). The control element 4a is electrically connected to the control electrode 311 of the semiconductor element 31 via the wiring portions 2 and the connecting member 71. Accordingly, a driving signal output from the control element 4a is input to the control electrode 311 of the semiconductor element 31 via the wiring portions 2 and the connecting member 71.

The control element 4b controls driving of the semiconductor element 32. Specifically, the control element 4b controls a switching operation of the semiconductor element 32 by inputting the second driving signal (e.g., gate voltage) to the control electrode 321 (gate electrode) of the semiconductor element 32. The control element 4b generates the second driving signal for causing the semiconductor element 32 to operate as the lower arm. Each of the plurality of connecting members 73 is joined to the control element 4b. The control element 4b is electrically connected to the control electrode 321 of the semiconductor element 32 via the connecting members 73, the wiring portions 2, and the connecting member 71. Accordingly, a driving signal output from the control element 4b is input to the control electrode 321 of the semiconductor element 32 via the connecting members 73, the wiring portions 2, and the connecting member 71.

As shown in FIG. 3, the plurality of passive elements 5 are arranged on the substrate obverse surface 11 of the insulating substrate 1. Each of the passive elements 5 is joined to a pad portion 21 (wiring portion 2) and is electrically connected to the wiring portion 2. The plurality of passive elements 5 are, for example, resistors, capacitors, coils, diodes, or the like. The plurality of passive elements 5 include, for example, a plurality of thermistors 5a and a plurality of resistors 5b.

Each of the plurality of thermistors 5a is arranged spanning two pad portions 21 of wiring portions 2. Each thermistor 5a is joined and electrically connected to these two pad portions 21. The pad portions 21 are electrically connected to two different leads 60, respectively, via the wiring portions 2. Each thermistor 5a outputs a current corresponding to ambient temperature as a result of voltage being applied between the two leads 60.

Each of the plurality of resistors 5b is arranged spanning two pad portions 21 of wiring portions 2. Each resistor 5b is joined and electrically connected to these two pad portions 21. Out of the two pad portions 21 to which a resistor 5b is joined, one pad portion 21 is electrically connected to the control element 4a or 4b, and the other pad portion 21 is electrically connected to the control electrode 311 or 321 of the semiconductor element 31 or 32 via the connecting member 71. In the present embodiment, each resistor 5b is a gate resistor, for example.

The lead frames 6 contain a metal material. The lead frames 6 have a higher heat conductivity than the insulating substrate 1. For example, copper (Cu), aluminum, iron (Fe), oxygen-free copper, or an alloy of any of these metals (e.g., a Cu—Sn alloy, a Cu—Zr alloy, a Cu—Fe alloy, etc.) is used as a constituent material of the lead frames 6. Surfaces of the lead frames 6 may be plated with nickel as appropriate. The lead frames 6 may be formed through pressing in which a mold is pressed against a metal plate, or by etching a metal plate, for example. The thickness (length in the z direction) of each lead frame 6 is not particularly limited, but is larger than the thickness (length in the z direction) of the wiring portions 2. The thickness of each lead frame 6 is, for example, at least 0.4 mm and not larger than 0.8 mm. The lead frames 6 are spaced apart from each other. As shown in FIG. 3, the lead frames 6 include the plurality of leads 61 to 64, 69, and 60. Each of the plurality of leads 61 to 64, 69, and 60 includes a portion that is covered by the resin member 8 and a portion that is exposed from the resin member 8.

Each of the two leads 61 and 62 is supported by the resin member 8 and the insulating substrate 1. As shown in FIG. 3, the lead 61 includes a pad portion 611 and a terminal portion 612. The pad portion 611 and the terminal portion 612 are connected to each other. As shown in FIG. 3, the lead 62 includes a pad portion 621 and a terminal portion 622. The pad portion 621 and the terminal portion 622 are connected to each other. The lead 61 is an example of a "first lead", and the lead 62 is an example of a "second lead".

Each of the pad portions 611 and 621 is covered by the resin member 8. Each of the pad portions 611 and 621 is arranged on the substrate obverse surface 11 of the insulating substrate 1 and overlaps with the insulating substrate 1 in a plan view. Each of the pad portions 611 and 621 has a rectangular shape in a plan view, for example. Each of the pad portions 611 and 621 is joined to the substrate obverse surface 11 using a joining material (not shown). A metal layer may be provided on the substrate obverse surface 11 to which the pad portions 611 and 621 are joined, to increase the strength of joining between each of the pad portions 611 and 621 and the insulating substrate 1. If the metal layer is made of the same material as the wiring portions 2, the metal layer can be formed together with the wiring portions 2.

The semiconductor element 31 and the protective element 39A are mounted on the pad portion 611. The reverse surface electrode 313 (drain electrode) of the semiconductor element 31 and the reverse surface electrode 392 (cathode electrode) of the protective element 39A are joined to the pad portion 611 using a conductive joining material (not shown). For example, solder, a metal paste, a sintered metal, or the like is used as the conductive joining material. As a result, the reverse surface electrode 313 of the semiconductor element 31 and the reverse surface electrode 392 of the protective element 39A are electrically connected to each other. The element reverse surface 31b of the semiconductor element 31 and the reverse surface (surface facing the z1 direction) of the protective element 39A face the pad portion 611. The pad portion 611 is an example of a "first pad portion".

The semiconductor element 32 and the protective element 39B are mounted on the pad portion 621. The reverse surface electrode 323 (drain electrode) of the semiconductor element 32 and the reverse surface electrode 392 (cathode electrode) of the protective element 39B are joined to the pad portion 621 using a conductive joining material (not shown). For example, solder, a metal paste, a sintered metal, or the like is used as the conductive joining material. As a result, the reverse surface electrode 323 of the semiconductor element 32 and the reverse surface electrode 392 of the protective element 39B are electrically connected to each other. The element reverse surface 32b of the semiconductor element 32 and the reverse surface (surface facing the z1 direction) of the protective element 39B face the pad portion 621. The pad portion 621 is an example of a "second pad portion".

Each of the terminal portions 612 and 622 is exposed from the resin member 8. Each of the terminal portions 612 and 622 is bent in the z2 direction. The terminal portions 612 and 622 are external terminals of the electronic device A1. The pad portion 611 is electrically connected to the reverse surface electrode 313 (drain electrode) of the semiconductor element 31, and accordingly, a drain current of the semiconductor element 31 flows through the terminal portion 612. Also, the pad portion 621 is electrically connected to the reverse surface electrode 323 (drain electrode) of the semiconductor element 32, and accordingly, a drain current of the semiconductor element 32 flows through the terminal portion 622. The terminal portion 612 is an example of a "first terminal portion", and the terminal portion 622 is an example of a "second terminal portion".

Each of the two leads 63 and 64 is supported by the resin member 8. As shown in FIG. 3, the lead 63 includes a pad portion 631 and a terminal portion 632. The pad portion 631 and the terminal portion 632 are connected to each other. As shown in FIG. 3, the lead 64 includes a pad portion 641 and a terminal portion 642. The pad portion 641 and the terminal portion 642 are connected to each other. The lead 63 is an example of a "third lead", and the lead 64 is an example of a "fourth lead".

Each of the pad portions 631 and 641 is covered by the resin member 8. Each of the pad portions 631 and 641 does not overlap with the insulating substrate 1 in a plan view. A plurality of connecting members 72 are joined to each of the pad portions 631 and 641. Each connecting member 72 joined to the pad portion 631 is also joined to the obverse surface electrode 322 of the semiconductor element 32. Thus, the pad portion 631 is electrically connected to the obverse surface electrode 322 (source electrode) of the semiconductor element 32 via the connecting members 72. Each connecting member 72 joined to the pad portion 641 is also joined to the obverse surface electrode 312 of the semiconductor element 31. Thus, the pad portion 641 is electrically connected to the obverse surface electrode 312 (source electrode) of the semiconductor element 31 via the connecting members 72.

Each of the terminal portions 632 and 642 is exposed from the resin member 8. Each of the terminal portions 632 and 642 is bent in the z2 direction. The terminal portions 632 and 642 are external terminals of the electronic device A1. The pad portion 631 is electrically connected to the obverse surface electrode 322 (source electrode) of the semiconductor element 32, and accordingly, a source current of the semiconductor element 32 flows through the terminal portion 632. Also, the pad portion 641 is electrically connected to the obverse surface electrode 312 (source electrode) of the semiconductor element 31, and accordingly, a source current of the semiconductor element 31 flows through the terminal portion 642.

Each of the plurality of leads 69 is supported by the resin member 8 and the insulating substrate 1. As shown in FIG. 3, each lead 69 includes a pad portion 691 and a terminal portion 692. In each lead 69, the pad portion 691 and the terminal portion 692 are connected to each other.

Each pad portion 691 is covered by the resin member 8. The pad portions 691 are arranged on the substrate obverse surface 11 of the insulating substrate 1 and overlap with the insulating substrate 1 in a plan view. The pad portions 691 are joined to pad portions 21 of wiring portions 2 using a conductive joining material (not shown). The pad portions 21 to which the pad portions 691 are joined are electrically connected to the control elements 4a and 4b (control unit 41) via connection wires 22. Accordingly, the pad portions 691 are electrically connected to the control elements 4a and 4b (control unit 41) via the wiring portions 2.

Each terminal portion 692 is exposed from the resin member 8. Each terminal portion 692 is bent in the z2 direction. The terminal portions 692 are external terminals of the electronic device A1. The pad portions 691 are electrically connected to the control elements 4a and 4b (control unit 41), and accordingly, each of the terminal portions 692 is an input terminal of various control signals to the control unit 41, or an output terminal of various control signals from the control unit 41, or an input terminal of operating power to the control elements 4a and 4b.

Each of the plurality of leads 60 is supported by the resin member 8 and the insulating substrate 1. The leads 60 are electrically connected to the thermistors 5a. In the present embodiment, two leads 60 are provided for each of the two thermistors 5a. That is, the electronic device A1 includes four leads 60. As shown in FIG. 3, each lead 60 includes a pad portion 601 and a terminal portion 602. In each lead 60, the pad portion 601 and the terminal portion 602 are electrically connected to each other.

Each pad portion 601 is covered by the resin member 8. Each pad portion 601 is arranged on the substrate obverse surface 11 of the insulating substrate 1 and overlaps with the insulating substrate 1 in a plan view. The pad portions 601 are joined to pad portions 21 of wiring portions 2 using a conductive joining material (not shown). Each of the pad portions 21 to which the pad portions 601 are joined is electrically connected to either of the two thermistors 5a via a connection wire 22. Accordingly, the pad portions 601 are electrically connected to the thermistors 5a via wiring portions 2.

Each terminal portion 602 is exposed from the resin member 8. Each terminal portion 602 is bent in the z2 direction. The terminal portions 602 overlap with the terminal portions 692 as viewed in the x direction. The terminal portions 602 are external terminals of the electronic device A1. The pad portions 601 are electrically connected to the thermistors 5a, and therefore, the terminal portions 602 are temperature detection terminals.

The pad portion 611 and the pad portion 621 of the lead frames 6 are arranged in the x direction with a first separation region S1 sandwiched between the pad portions 611 and 621. In the present embodiment, "region" is a concept that includes a three-dimensional space, and whether or not there is an object in the space is not limited. The control unit 41 is arranged in the first separation region S1. Accordingly, as shown in FIG. 8, the entirety of the control unit 41 overlaps with the first separation region S1 as viewed in the y direction. Also, as shown in FIG. 3, the entirety of the control unit 41 overlaps with the first separation region S1 as viewed in the x direction. In the present embodiment, the lead frames 6 are not located in the first separation region S1. In the present embodiment, some of the passive elements 5 are also arranged in the first separation region S1.

Each of the plurality of connecting members 71 to 74 electrically connects two members that are spaced apart from each other. The plurality of connecting members 71 to 74 are bonding wires. Instead of the bonding wires, plate-shaped lead members may be used as the plurality of connecting members 71 to 74 as appropriate.

As shown in FIG. 3, each of the connecting members 71 is joined to the control electrode 311 or 321 (gate electrode) of the semiconductor element 31 or 32 and a pad portion 21, and electrically connects the control electrode 311 or 321 and the pad portion 21 to each other. Each of the pad portions 21 to which the connecting members 71 are joined is electrically connected to either of the two control elements 4a and 4b (control unit 41) via a connection wire 22. For example, Au is used as a constituent material of the connecting members 71, but Cu or A1 may also be used. The wire diameter and the number of connecting members 71 are not limited to those shown in FIG. 3.

As shown in FIG. 3, each of the plurality of connecting members 72 is joined to the obverse surface electrode 312 or 322 (source electrode) of the semiconductor element 31 or 32 and the pad portion 641 or 631 of the lead 64 or 63, and electrically connects the obverse surface electrode 312 or 322 and the pad portion 641 or 631 to each other. As shown in FIGS. 3 and 6, out of the plurality of connecting members 72, intermediate portions of the connecting members 72 that are joined to the obverse surface electrode 312 of the semiconductor element 31 and the pad portion 641 of the lead 64 are also joined to the obverse surface electrode 391 of the protective element 39A. Thus, the obverse surface electrode 312 (source electrode) of the semiconductor element 31 and the obverse surface electrode 391 (anode electrode) of the protective element 39A are electrically connected to each other. Also, as shown in FIG. 3, out of the plurality of connecting members 72, intermediate portions of the connecting members 72 that are joined to the obverse surface electrode 322 of the semiconductor element 32 and the pad portion 631 of the lead 63 are also joined to the obverse surface electrode 391 of the protective element 39B. Thus, the obverse surface electrode 322 (source electrode) of the semiconductor element 32 and the obverse surface electrode 391 (anode electrode) of the protective element 39B are electrically connected to each other. For example, A1 or Cu is used as a constituent material of the connecting members 72, but Au may also be used. The wire diameter and the number of connecting members 72 are not limited to those shown in FIG. 3.

In the example shown in FIGS. 3 and 6, the obverse surface electrode 312 (semiconductor element 31), the obverse surface electrode 391 (protective element 39A), and the pad portion 641 (lead 64) are electrically connected to each other by the connecting members 72, but there is no limitation to this configuration. For example, a wire that electrically connects the obverse surface electrode 312 and the obverse surface electrode 391 of the protective element 39A to each other and a wire that electrically connects the obverse surface electrode 391 of the protective element 39A and the pad portion 641 to each other may be provided separately from each other, instead of the connecting members 72. Alternatively, a wire that electrically connects the obverse surface electrode 312 and the pad portion 641 to each other and a wire that electrically connects the obverse surface electrode 312 and the obverse surface electrode 391 of the protective element 39A to each other may be provided separately from each other, instead of the connecting members 72. Similar can also be said for the connecting members 72 that electrically connect the obverse surface electrode 322 (semiconductor element 32), the obverse surface electrode 391 (protective element 39B), and the pad portion 631 (lead 63) to each other.

As shown in FIG. 3, each of the plurality of connecting members 73 is joined to the control element 4b and a pad portion 21 of a wiring portion 2, and electrically connects the control element 4b and the wiring portion 2 to each other. For example, Au is used as a constituent material of the connecting members 73, but Cu or A1 may also be used. The wire diameter and the number of connecting members 73 are not limited to those shown in FIG. 3.

The connecting member 74 is joined to the obverse surface electrode 312 of the semiconductor element 31 and a pad portion 21, and electrically connects the obverse surface electrode 312 and the pad portion 21 to each other. Accordingly, a detection signal for detecting a current (e.g., a source current) flowing through the obverse surface electrode 322 of the semiconductor element 32 is transmitted to the wiring portion 2. For example, Au is used as a constituent material of the connecting member 74, but Cu or A1 may also be used. The wire diameter and the number of connecting members 74 are not limited to those shown in FIG. 3. Unlike the illustrated example, a configuration is also possible that further includes a connecting member 74 that is joined to the obverse surface electrode 322 of the semiconductor element 32 and a pad portion 21.

The resin member 8 covers the insulating substrate 1 (except for the substrate reverse surface 12), the wiring portions 2, the two semiconductor elements 31 and 32, the control unit 41, the plurality of passive elements 5, portions of the lead frames 6, and the plurality of connecting members 71 to 74. For example, a material that has an insulating property such as an epoxy resin or silicone gel is used as a constituent material of the resin member 8. The resin member 8 is formed through molding, for example.

The resin member 8 includes a resin obverse surface 81, a resin reverse surface 82, and a plurality of resin side surfaces 831 to 834 as shown in FIGS. 1 to 8. The resin obverse surface 81 and the resin reverse surface 82 are spaced apart from each other in the z direction as shown in FIGS. 6 to 8. The resin obverse surface 81 faces the z2 direction, and the resin reverse surface 82 faces the z1 direction. Each of the resin obverse surface 81 and the resin reverse surface 82 is a flat surface that is orthogonal to the z direction. The substrate reverse surface 12 is exposed from the resin reverse surface 82. In the present embodiment, the substrate reverse surface 12 and the resin reverse surface 82 are flush with each other as shown in FIGS. 6 to 8, but a configuration is also possible in which the substrate reverse surface 12 and the resin reverse surface 82 are not flush with each other. Each of the plurality of resin side surfaces 831 to 834 is connected to the resin obverse surface 81 and the resin reverse surface 82. As shown in FIGS. 2 and 3, the two resin side surfaces 831 and 832 are spaced apart from each other in the x direction. The resin side surface 831 faces the x1 direction, and the resin side surface 832 faces the x2 direction. As shown in FIGS. 2 and 3, the two resin side surfaces 833 and 834 are spaced apart from each other in the y direction. The resin side surface 833 faces the y1 direction, and the resin side surface 834 faces the y2 direction. In the illustrated example, each of the resin side surfaces 831 to 834 is constituted by a surface of which a center portion in the z direction is bent, but the resin side surfaces 831 to 834 may be flat surfaces that are not bent.

In the electronic device A1, each of the plurality of leads 61 to 64 protrudes from the resin side surface 833, and each of the plurality of leads 69 protrudes from the resin side surface 834. Accordingly, terminals for power, which are electrically connected to the semiconductor elements 31 and 32, and terminals for control signals, which are electrically connected to the control unit 41 (the control elements 4a and 4b), protrude from opposite side surfaces.

Functions and advantageous effects of the electronic device A1 are the following.

The electronic device A1 includes the insulating substrate 1 and the wiring portions 2 formed on the substrate obverse surface 11. The wiring portions 2 transmit control signals (e.g., the first driving signal and the second driving signal) for controlling the semiconductor elements 31 and 32, and constitute transmission paths of the control signals. For example, driving signals for controlling driving of the semiconductor elements 31 and 32 are output from the control unit 41 (the control elements 4a and 4b) and are input to the control electrodes 311 and 321 via the wiring portions 2 and the connecting members 71. The wiring portions 2 are formed by, for example, printing a silver paste, and then firing the silver paste. With this configuration, it is possible to make the transmission paths of the control signals thin and increase the density of the transmission paths, when compared with a case where the transmission paths of the control signals are constituted by metal lead frames, for example. Therefore, the integration density of the electronic device A1 can be increased.

In the electronic device A1, the pad portion 611 to which the semiconductor element 31 is joined and the pad portion 621 to which the semiconductor element 32 is joined are arranged in the x direction with the first separation region S1 sandwiched between the pad portions 611 and 621. The control unit 41 that controls the semiconductor elements 31 and 32 overlaps with the first separation region S1 as viewed in the y direction. With this configuration, it is possible to reduce a difference between the distance from the control unit 41 to the semiconductor element 31 and the distance from the control unit 41 to the semiconductor element 32. Accordingly, it is possible to reduce a difference between a transmission time of the first driving signal that is input from the control unit 41 (control element 4a) to the semiconductor element 31 (control electrode 311) and a transmission time of the second driving signal that is input from the control unit 41 (control element 4b) to the semiconductor element 32 (control electrode 321).

In the electronic device A1, the semiconductor element 31 is joined to the pad portion 611, and the reverse surface electrode 313 of the semiconductor element 31 and the lead 61 are electrically connected to each other. Also, the obverse surface electrode 312 of the semiconductor element 31 is electrically connected to the lead 64 via the plurality of connecting members 72. Similarly, the semiconductor element 32 is joined to the pad portion 621, and the reverse surface electrode 323 of the semiconductor element 32 and the lead 62 are electrically connected to each other. Also, the obverse surface electrode 322 of the semiconductor element 32 is electrically connected to the lead 63 via the plurality of connecting members 72. With this configuration, paths through which a relatively large current flows to the semiconductor elements 31 and 32 are constituted by the plurality of leads 61 to 64 (lead frames 6). Therefore, allowable current in the current paths can be increased, when compared with a case where the current paths to the semiconductor elements 31 and 32 are constituted by wiring portions 2. That is, it is possible to increase the integration density of the electronic device A1 while securing allowable current to the semiconductor elements 31 and 32.

In the electronic device A1, the lead frames 6 (leads 61 and 62) have a higher heat conductivity than the insulating substrate 1. Therefore, it is possible to suppress a reduction in heat dissipation from the semiconductor elements 31 and 32, which may occur when the insulating substrate 1 is used. In particular, the semiconductor elements 31 and 32 are respectively mounted on the pad portions 611 and 621 of the leads 61 and 62, and therefore, heat can be efficiently transmitted from the semiconductor elements 31 and 32 to the leads 61 and 62, respectively. Also, the leads 61 and 62 are exposed from the resin member 8, and accordingly, the leads 61 and 62 constitute conduction paths from the outside to the semiconductor elements 31 and 32, and heat dissipation properties of the semiconductor elements 31 and 32 can be further ensured. Furthermore, the substrate reverse surface 12 of the insulating substrate 1 is exposed from the resin member 8 (resin reverse surface 82), and therefore, heat conducted from the semiconductor elements 31 and 32 to the insulating substrate 1 can be dissipated to the outside more efficiently.

In the electronic device A1, the control element 4a is covered by the resin package 401 and constitutes the control device 40. If the control element 4a is used instead of the control device 40, a high voltage large current that is required in shipment inspection cannot be passed through the control element 4a as is, and therefore, shipment inspection cannot be performed until a complete product covered by the resin member 8 is obtained. In this case, if the control element 4a is determined as being defective in the shipment inspection, the whole complete product will be discarded even if components other than the control element 4a work properly. On the other hand, in the control device 40, the control element 4a is covered by the resin package 401, and therefore, a high voltage large current required in the shipment inspection can be passed through the control element 4a. Accordingly, it is possible to inspect the control device 40 before the control device 40 is mounted, and discard only a defective device. That is, the electronic device A1 can be manufactured using only non-defective control devices 40, and therefore, it is possible to keep properly working components from being wasted. Also, when the control element 4*a* is configured as the control device 40, the wiring portions 2 can also be formed in a region of the substrate obverse surface 11 with which the control device 40 overlaps in a plan view (see FIG. 3).

Figure 10:
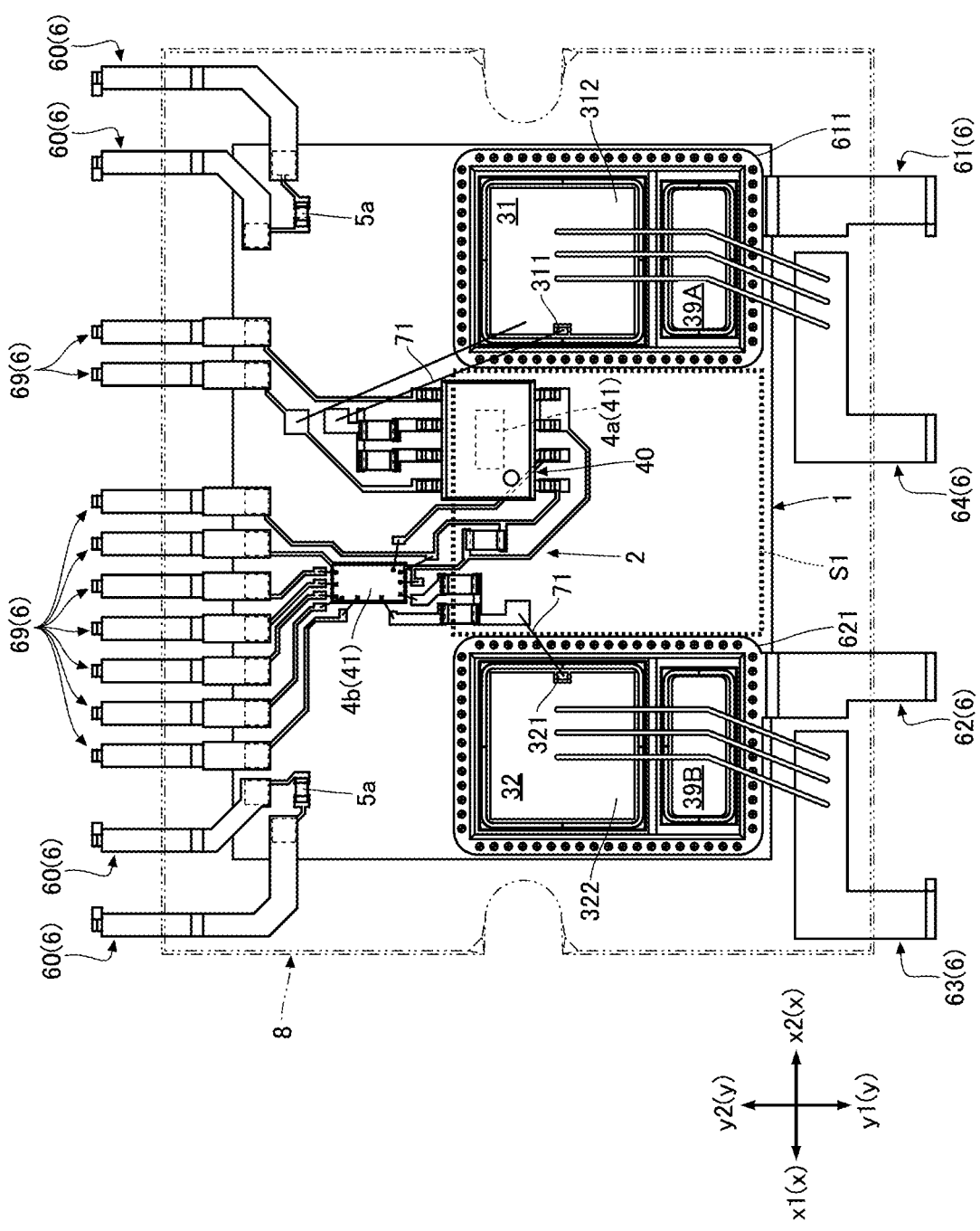
FIG. 10 is a plan view showing an electronic device according to a variation of the first embodiment, in which the resin member is shown using an imaginary line.

In the first embodiment, a case where the entirety of the control unit 41 (two control elements 4*a* and 4*b*) overlaps with the first separation region S1 as viewed in the x direction is described, but there is no limitation to this case. For example, as shown in FIG. 10, a portion of the control unit 41 may overlap with the first separation region S1 as viewed in the x direction. A configuration is also possible in which the control unit 41 does not overlap with the first separation region S1 as viewed in the x direction. In these variations, the control unit 41 is preferably arranged as follows. That is, as shown in FIG. 10, the control unit 41 is preferably arranged on the leads 69 side in the y direction with respect to the first separation region S1.

Figure 11:
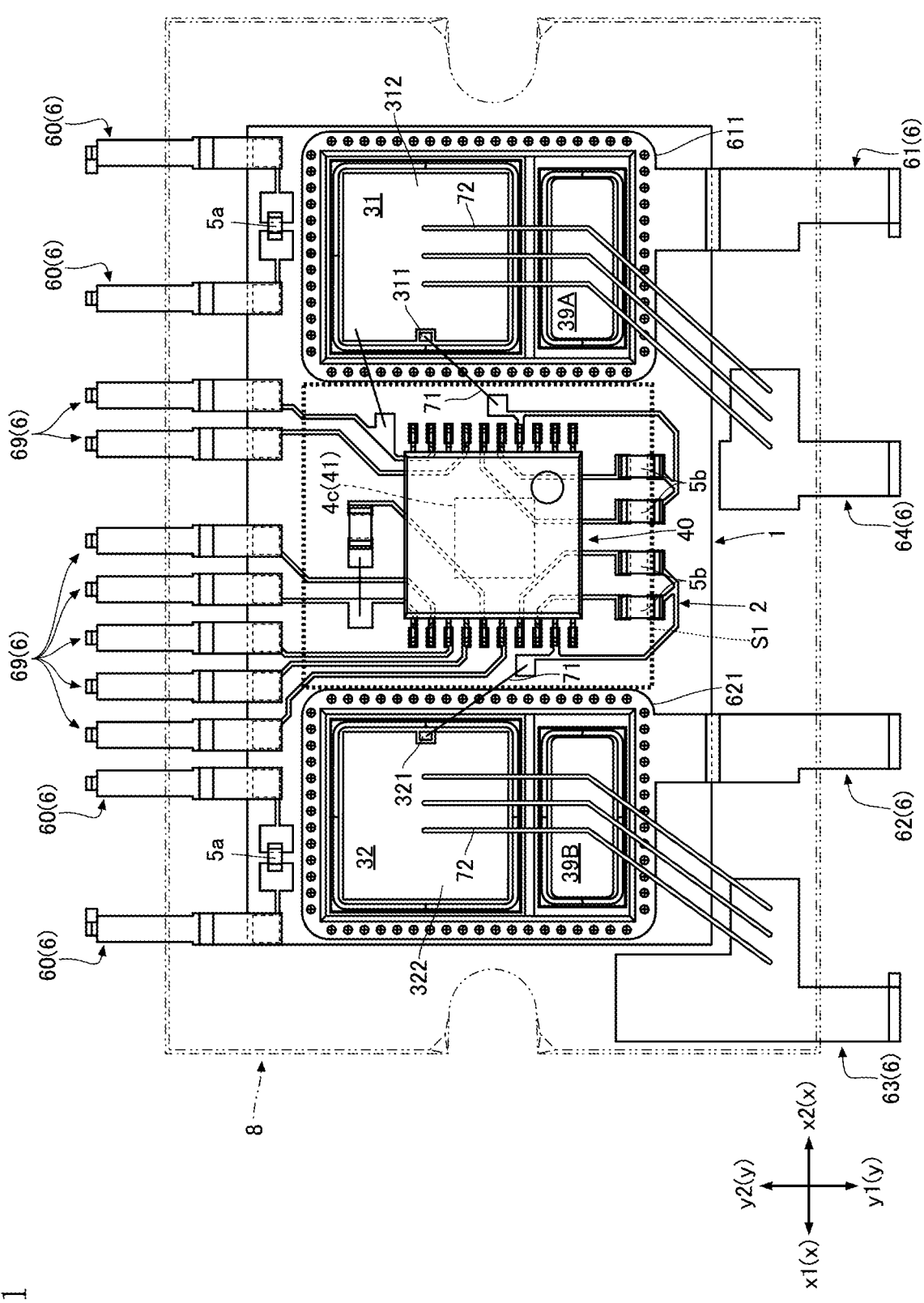
FIG. 11 is a plan view showing an electronic device according to a variation of the first embodiment, in which the resin member is shown using an imaginary line.

In the first embodiment, an example in which the control unit 41 includes the two control elements 4*a* and 4*b* and driving of the semiconductor elements 31 and 32 is controlled by the control elements 4*a* and 4*b* is described, but there is no limitation to this example. For example, driving of the two semiconductor elements 31 and 32 may be controlled by a single control element 4*c* as shown in FIG. 11. FIG. 11 is a plan view showing an electronic device according to this variation, in which the resin member 8 is shown using an imaginary line. The control element 4*c* inputs the first driving signal to the semiconductor element 31 (control electrode 311) and inputs the second driving signal to the semiconductor element 32 (control electrode 321). In FIG. 11, the control element 4*c* is covered by the resin package 401 and is configured as the control device 40, but a configuration is also possible in which the control element 4*c* is not covered by the resin package 401.

Figure 12:
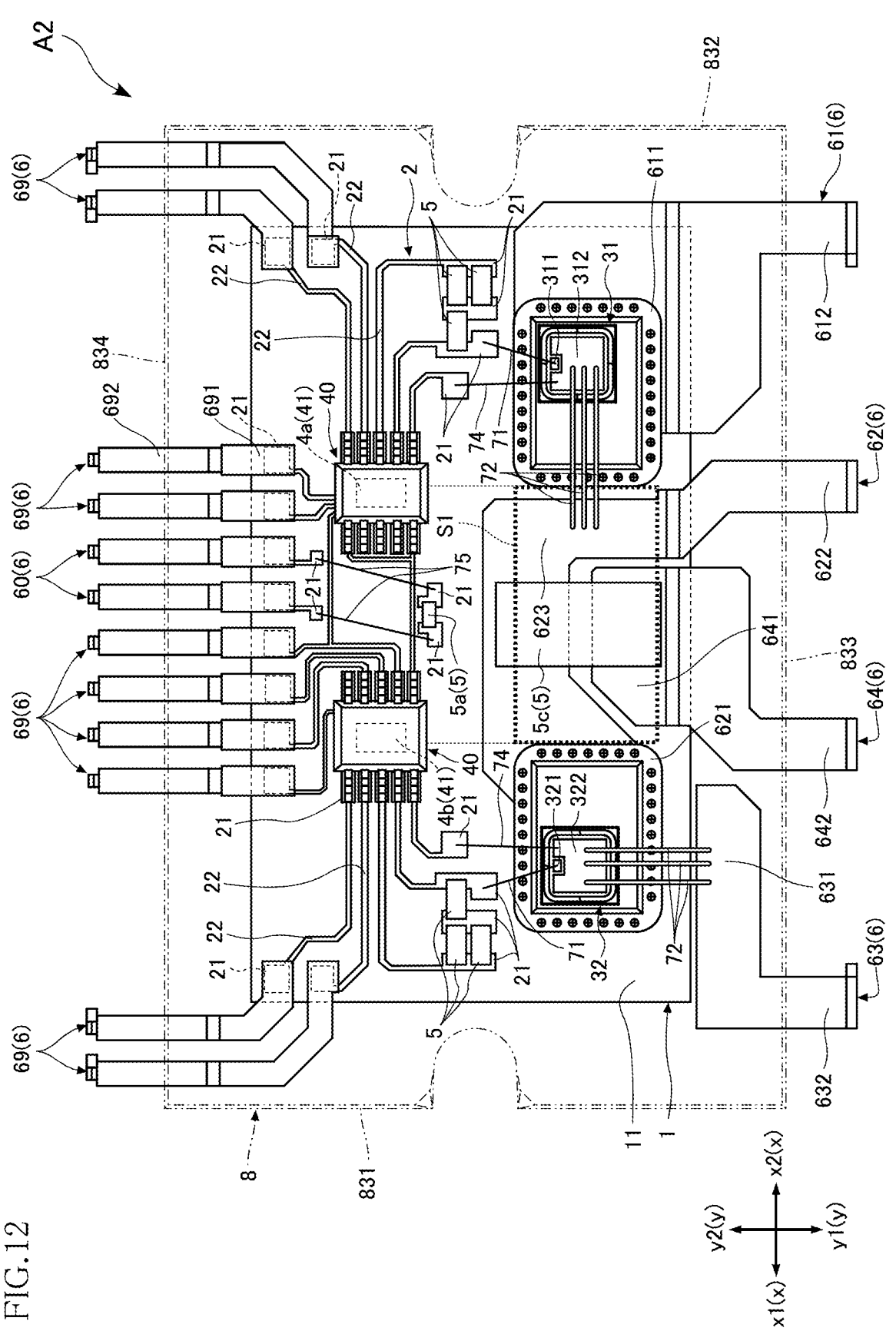
FIG. 12 is a plan view showing an electronic device according to a second embodiment, in which the resin member is shown using an imaginary line.
Figure 13:
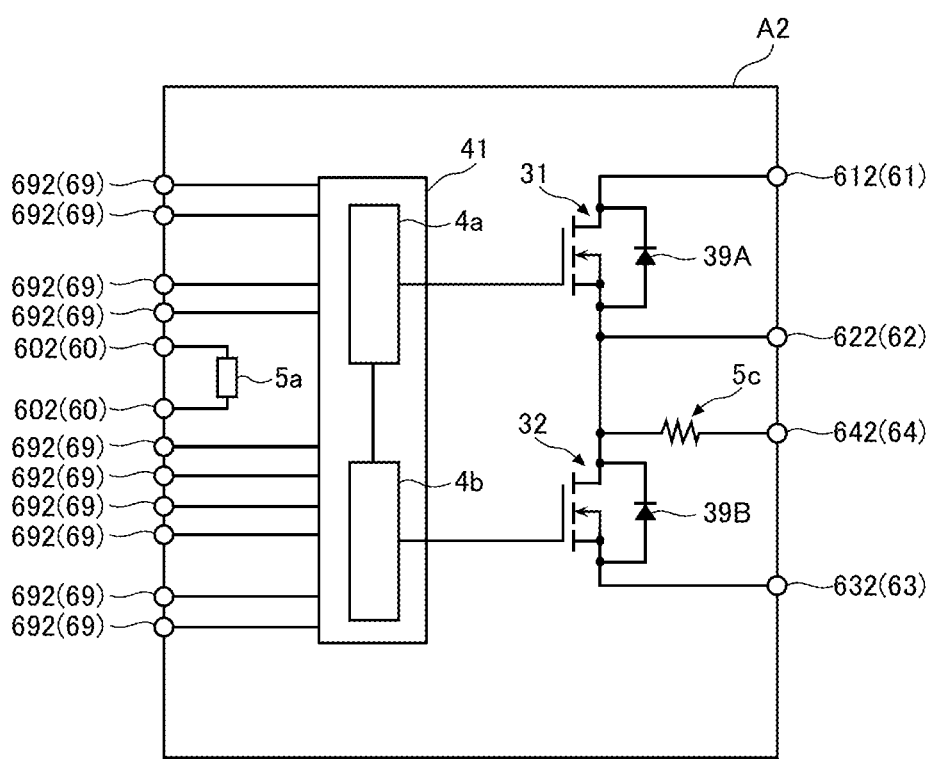
FIG. 13 is an example of a circuit diagram of the electronic device according to the second embodiment.

FIGS. 12 and 13 show an electronic device A2 according to a second embodiment. FIG. 12 is a plan view of the electronic device A2, in which the resin member 8 is shown using an imaginary line. FIG. 13 is a circuit diagram showing a circuit configuration of the electronic device A2.

As shown in FIGS. 12 and 13, unlike the electronic device A1, in the electronic device A2, the two semiconductor elements 31 and 32 are electrically connected to each other inside the resin member 8. In the electronic device A2, the two semiconductor elements 31 and 32 are connected in series to each other and constitute a leg with a configuration described below as shown in FIG. 13, for example. The semiconductor element 31 constitutes an upper arm circuit of the leg, and the semiconductor element 32 constitutes a lower arm circuit of the leg. In the example shown in FIGS. 12 and 13, the electronic device A2 does not include the two protective elements 39A and 39B, but the electronic device A2 may include the protective elements 39A and 39B similarly to the electronic device A1.

As shown in FIG. 12, in the electronic device A2, the plurality of connecting members 72 joined to the obverse surface electrode 312 of the semiconductor element 31 are joined to the lead 62 (a pad portion 623, which will be described later), rather than the lead 64. As a result, the obverse surface electrode 312 of the semiconductor element 31 and the reverse surface electrode 323 of the semiconductor element 32 are electrically connected to each other via the plurality of connecting members 72 and the lead 62.

In the electronic device A2, the lead 62 of the lead frames 6 includes the pad portion 621, the terminal portion 622, and the pad portion 623. That is, compared with the lead 62 of the electronic device A1, the lead 62 of the electronic device A2 further includes the pad portion 623. The pad portion 623 is connected to the pad portion 621 and the terminal portion 622 and is located between the pad portion 621 and the terminal portion 622. The plurality of connecting members 72 joined to the obverse surface electrode 312 of the semiconductor element 31 are joined to the pad portion 623. Also, one of the plurality of passive elements 5 is joined to the pad portion 623. This passive element 5 is, for example, a shunt resistor 5*c*. The shunt resistor 5*c* is arranged spanning the pad portion 623 (lead 62) and the pad portion 641 (lead 64), and is joined and electrically connected to the pad portion 623 and the pad portion 641. A current flowing to the lead 62 is diverted by the shunt resistor 5*c* and transmitted to the lead 64. Accordingly, a current diverted from the current flowing to the lead 62 flows to the terminal portion 642.

In the electronic device A2, for example, power supply voltage is applied between the two leads 61 and 63. The lead 61 is a positive electrode (P terminal) and the lead 63 is a negative electrode (N terminal). The power supply voltage input between the two leads 61 and 63 is converted to AC power (voltage) through switching operations of the two semiconductor elements 31 and 32. Then, the AC power is output from the lead 62. Accordingly, the two leads 61 and 63 are input terminals for the power supply voltage, and the lead 62 is an output terminal for AC power of which the voltage has been converted by the two semiconductor elements 31 and 32.

The electronic device A2 further includes a plurality of connecting members 75. The connecting members 75 are bonding wires, for example, similarly to the other connecting members 71 to 74. For example, Au is used as a constituent material of the connecting members 75, but Cu or A1 may also be used. Each of the connecting members 75 electrically connects a wiring portion 2 that is electrically connected to a lead 60 and a wiring portion 2 that is electrically connected to a thermistor 5*a*.

Similarly to the electronic device A1, the electronic device A2 also includes wiring portions 2 formed on the substrate obverse surface 11. Similarly to the electronic device A1, the wiring portions 2 transmit control signals (e.g., driving signals) for controlling the semiconductor elements 31 and 32 and constitute transmission paths of the control signals. Therefore, with the electronic device A2, it is possible to make the transmission paths thin, increase the density of the transmission paths, and increase the integration density.

Similarly to the electronic device A1, in the electronic device A2, the pad portion 611 to which the semiconductor element 31 is joined and the pad portion 621 to which the semiconductor element 32 is joined are arranged in the x direction with the first separation region S1 sandwiched between the pad portions 611 and 621. The control unit 41 that controls the semiconductor elements 31 and 32 overlaps with the first separation region S1 as viewed in the y direction. Therefore, similarly to the electronic device A1, the electronic device A2 makes it possible to reduce a difference between a transmission time of the first driving signal that is input from the control unit 41 (control element 4*a*) to the semiconductor element 31 (control electrode 311) and a transmission time of the second driving signal that is input from the control unit 41 (control element 4*b*) to the semiconductor element 32 (control electrode 321).

Figure 14:
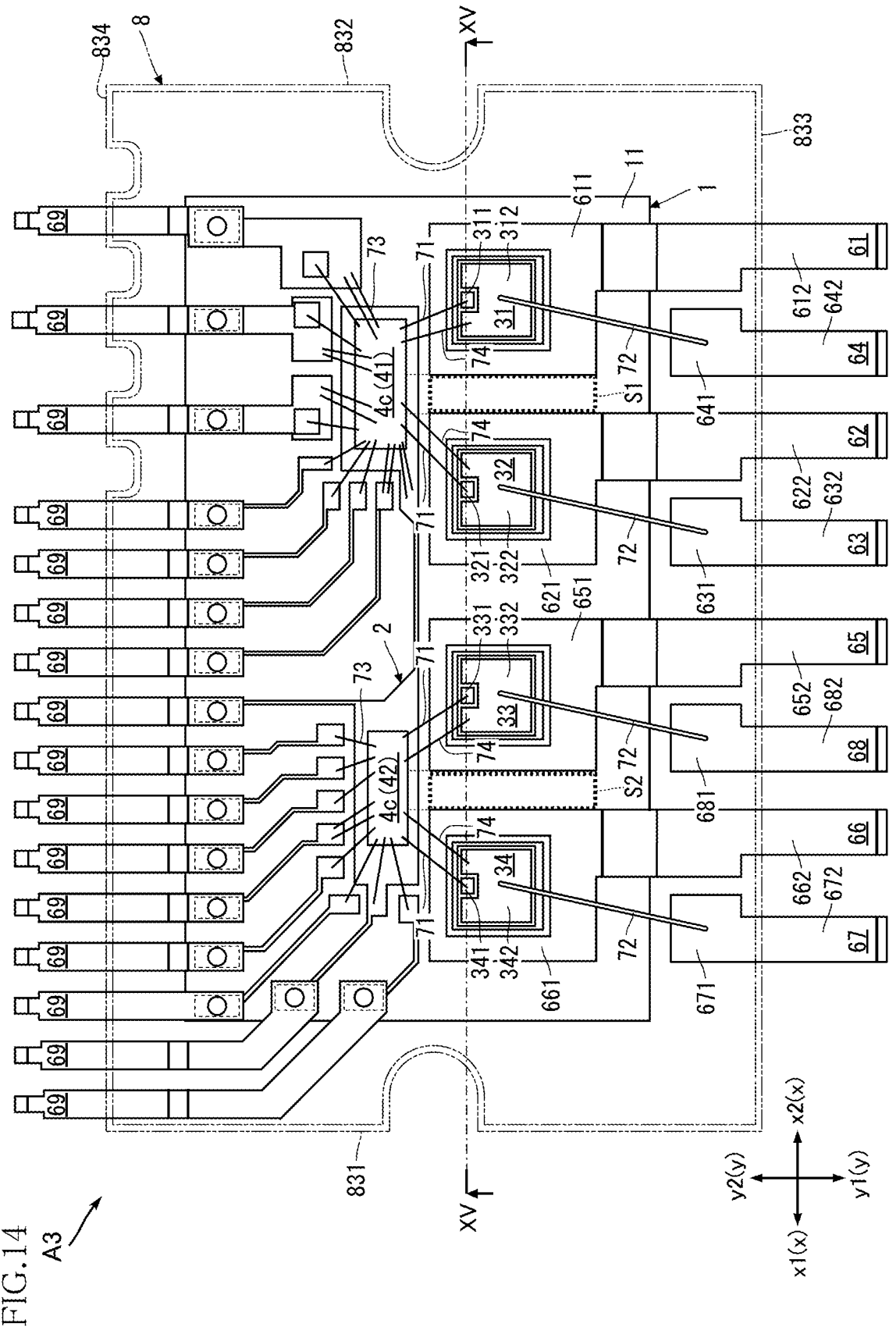
FIG. 14 is a plan view showing an electronic device according to a third embodiment, in which the resin member is shown using an imaginary line.
Figure 15:
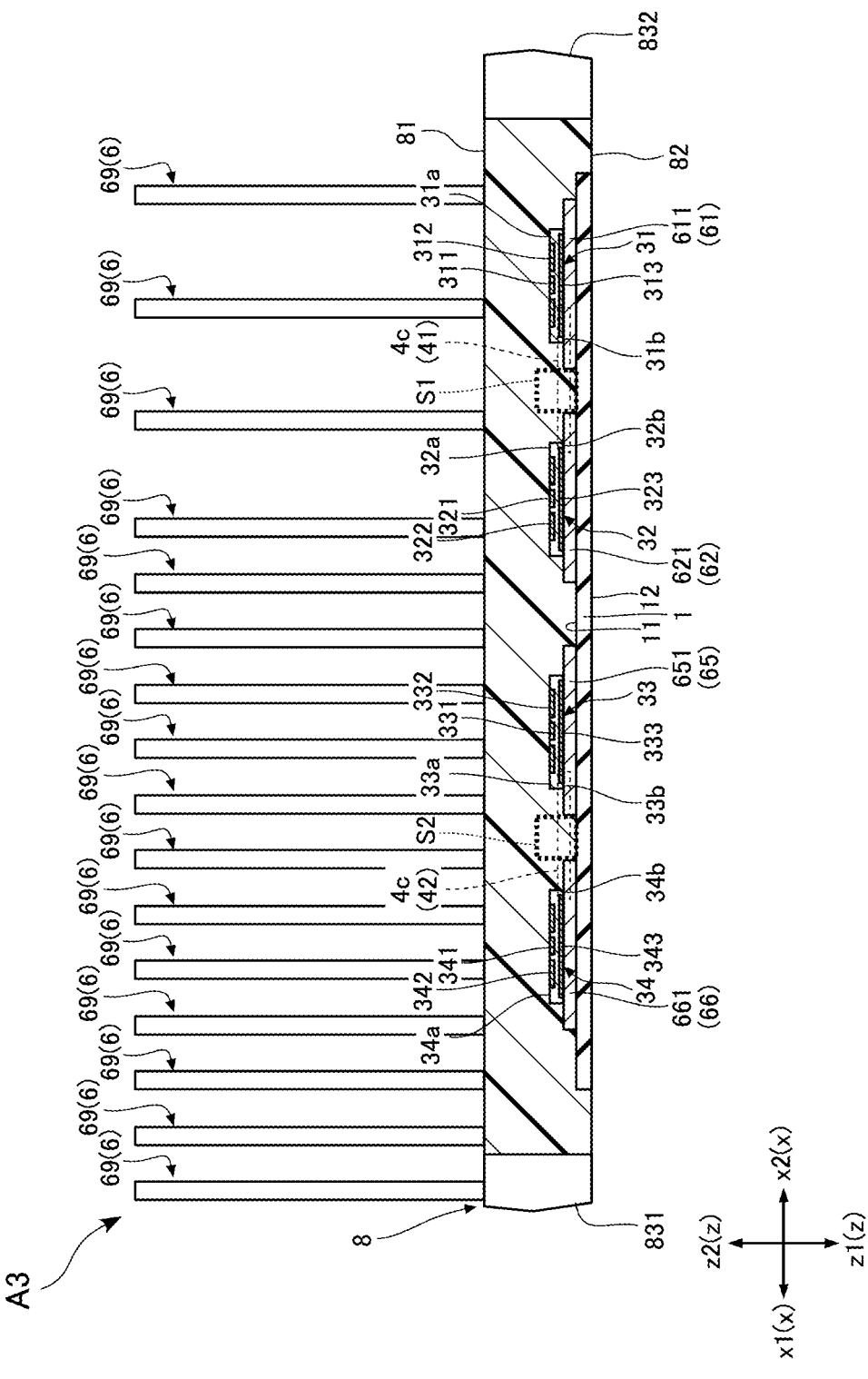
FIG. 15 is a cross-sectional view taken along line XV-XV in FIG. 14.
Figure 16:
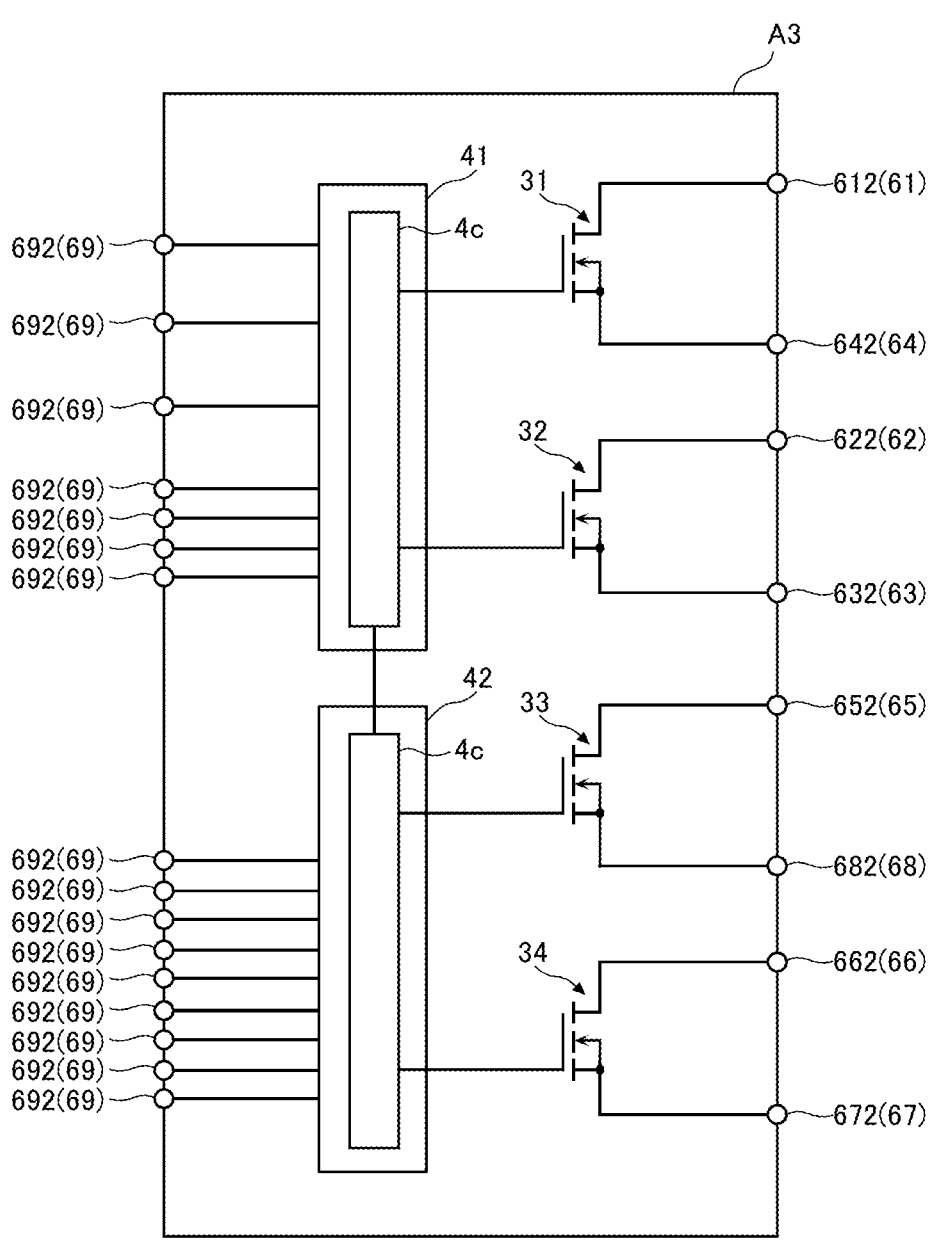
FIG. 16 is an example of a circuit diagram of the electronic device according to the third embodiment.

FIGS. 14 to 16 show an electronic device A3 according to a third embodiment. FIG. 14 is a plan view of the electronic device A3, in which the resin member 8 is shown using an imaginary line. FIG. 15 is a cross-sectional view taken along line XV-XV in FIG. 14. In FIG. 15, the connecting members 71 and 74 are omitted. FIG. 16 is a circuit diagram showing a circuit configuration of the electronic device A3.

As shown in FIGS. 14 to 16, the electronic device A3 differs from the electronic device A1 mainly in the following point. That is, the electronic device A3 includes four semiconductor elements 31 to 34 and two control units 41 and 42. Also, the lead frames 6 of the electronic device A3 further include a plurality of leads 65 to 68.

Similarly to the semiconductor elements 31 and 32, each of the two semiconductor elements 33 and 34 is a power transistor that controls power, for example. Each of the semiconductor elements 33 and 34 is a MOSFET constituted by an SiC substrate, for example. The semiconductor element 33 is arranged on the lead 65 (pad portion 651, which will be described later), and the semiconductor element 34 is arranged on the lead 66 (pad portion 661, which will be described later). The semiconductor element 33 is an example of a "third semiconductor element", and the semiconductor element 34 is an example of a "fourth semiconductor element".

The semiconductor element 33 is configured similarly to the semiconductor element 31. The semiconductor element 33 includes an element obverse surface 33*a* (third element obverse surface), an element reverse surface 33*b* (third element reverse surface), a control electrode 331 (third control electrode), an obverse surface electrode 332 (third obverse surface electrode), and a reverse surface electrode 333 (third reverse surface electrode). The element obverse surface 33*a* is configured similarly to the element obverse surface 31*a* of the semiconductor element 31, and the element reverse surface 33*b* is configured similarly to the element reverse surface 31*b* of the semiconductor element 31. Also, the control electrode 331, the obverse surface electrode 332, and the reverse surface electrode 333 are configured similarly to the control electrode 311, the obverse surface electrode 312, and the reverse surface electrode 313 of the semiconductor element 31, respectively. In an example in which the semiconductor element 33 is constituted by a MOSFET, the control electrode 331 is, for example, a gate electrode, the obverse surface electrode 332 is, for example, a source electrode, and the reverse surface electrode 333 is, for example, a drain electrode.

The semiconductor element 34 is configured similarly to the semiconductor element 32. The semiconductor element 34 includes an element obverse surface 34*a* (fourth element obverse surface), an element reverse surface 34*b* (fourth element reverse surface), a control electrode 341 (fourth control electrode), an obverse surface electrode 342 (fourth obverse surface electrode), and a reverse surface electrode 343 (fourth reverse surface electrode). The element obverse surface 34*a* is configured similarly to the element obverse surface 32*a* of the semiconductor element 32, and the element reverse surface 34*b* is configured similarly to the element reverse surface 32*b* of the semiconductor element 32. Also, the control electrode 341, the obverse surface electrode 342, and the reverse surface electrode 343 are configured similarly to the control electrode 321, the obverse surface electrode 322, and the reverse surface electrode 323 of the semiconductor element 32, respectively. In an example in which the semiconductor element 34 is constituted by a MOSFET, the control electrode 341 is, for example, a gate electrode, the obverse surface electrode 342 is, for example, a source electrode, and the reverse surface electrode 343 is, for example, a drain electrode.

A driving signal is input from the control unit 42 (control element 4*c*, which will be described later) to the control electrode 331 of the semiconductor element 33, and a conducting state and an interrupting state are switched according to the input driving signal. When the semiconductor element 33 is in the conducting state, a current flows from the reverse surface electrode 333 (drain electrode) to the obverse surface electrode 332 (source electrode), and when the semiconductor element 33 is in the interrupting state, the current does not flow. Similarly, a driving signal is input from the control unit 42 (control element 4*c*, which will be described later) to the control electrode 341 of the semiconductor element 34, and a conducting state and an interrupting state are switched according to the input driving signal. When the semiconductor element 34 is in the conducting state, a current flows from the reverse surface electrode 343 (drain electrode) to the obverse surface electrode 342 (source electrode), and when the semiconductor element 34 is in the interrupting state, the current does not flow.

As shown in FIGS. 14 and 15, the plurality of semiconductor elements 31 to 34 are arranged in the following order in the x direction. That is, the semiconductor elements are arranged in the order of the semiconductor element 31, the semiconductor element 32, the semiconductor element 33, and the semiconductor element 34 from the x2 side toward the x1 side. The plurality of semiconductor elements 31 to 34 overlap with each other as viewed in the x direction.

The control unit 42 controls driving of the semiconductor elements 33 and 34. The control unit 42 causes the semiconductor element 33 to operate as an upper arm (second upper arm) and causes the semiconductor element 34 to operate as a lower arm (second lower arm). The control unit 42 is arranged on the substrate obverse surface 11. The control unit 42 and the control unit 41 are arranged in the x direction, and the control unit 42 overlaps with the control unit 41 as viewed in the x direction. In a plan view, the control unit 42 does not overlap with the lead frames 6 and is spaced apart from the lead frames 6. The control unit 42 is an example of a "second control unit".

The control unit 42 includes the control element 4*c*. The control element 4*c* of the control unit 42 controls driving of the two semiconductor elements 33 and 34. Specifically, the control element 4*c* controls a switching operation of the semiconductor element 33 by inputting a third driving signal (e.g., gate voltage) to the control electrode 331 (gate electrode) of the semiconductor element 33. The control element 4*c* of the control unit 42 generates the third driving signal for causing the semiconductor element 33 to operate as the upper arm. Also, the control element 4*c* controls a switching operation of the semiconductor element 34 by inputting a fourth driving signal (e.g., gate voltage) to the control electrode 341 (gate electrode) of the semiconductor element 34. The control element 4*c* of the control unit 42 generates the fourth driving signal for causing the semiconductor element 34 to operate as the lower arm.

As described above, the lead frames 6 of the electronic device A3 include the plurality of leads 65 to 68 in addition to the plurality of leads 61 to 64 and 69 as shown in FIG. 14.

Each of the two leads 65 and 66 is supported by the resin member 8 and the insulating substrate 1. As shown in FIG. 14, the lead 65 includes a pad portion 651 and a terminal portion 652. The pad portion 651 and the terminal portion 652 are connected to each other. As shown in FIG. 14, the lead 66 includes a pad portion 661 and a terminal portion 662. The pad portion 661 and the terminal portion 662 are connected to each other.

Each of the pad portions 651 and 661 is covered by the resin member 8. Each of the pad portions 651 and 661 is arranged on the substrate obverse surface 11 of the insulating substrate 1 and overlaps with the insulating substrate 1 in a plan view. Each of the pad portions 651 and 661 has a rectangular shape in a plan view, for example. Each of the pad portions 651 and 661 is joined to the substrate obverse surface 11 using a joining material (not shown). A metal layer may be provided on the substrate obverse surface 11 to which the pad portions 651 and 661 are joined, to increase the strength of joining between each of the pad portions 651 and 661 and the insulating substrate 1. If the metal layer is made of the same material as the wiring portions 2, the metal layer can be formed together with the wiring portions 2.

The semiconductor element 33 is mounted on the pad portion 651. The reverse surface electrode 333 (drain electrode) of the semiconductor element 33 is joined and electrically connected to the pad portion 651 using a conductive joining material (not shown). For example, solder, a metal paste, a sintered metal, or the like is used as the conductive joining material. The element reverse surface 33b of the semiconductor element 33 faces the pad portion 651. The pad portion 651 is an example of a "third pad portion".

The semiconductor element 34 is mounted on the pad portion 661. The reverse surface electrode 343 (drain electrode) of the semiconductor element 34 is joined and electrically connected to the pad portion 661 using a conductive joining material (not shown). For example, solder, a metal paste, a sintered metal, or the like is used as the conductive joining material. The element reverse surface 34b of the semiconductor element 34 faces the pad portion 661. The pad portion 661 is an example of a "fourth pad portion".

Each of the terminal portions 652 and 662 is exposed from the resin member 8. Each of the terminal portions 652 and 662 is bent in the z2 direction. The terminal portions 652 and 662 are external terminals of the electronic device A3. The pad portion 651 is electrically connected to the reverse surface electrode 333 of the semiconductor element 33, and accordingly, a drain current of the semiconductor element 33 flows through the terminal portion 652. Also, the pad portion 661 is electrically connected to the reverse surface electrode 343 of the semiconductor element 34, and accordingly, a drain current of the semiconductor element 34 flows through the terminal portion 662.

Each of the two leads 67 and 68 is supported by the resin member 8. As shown in FIG. 14, the lead 67 includes a pad portion 671 and a terminal portion 672. The pad portion 671 and the terminal portion 672 are connected to each other. As shown in FIG. 14, the lead 68 includes a pad portion 681 and a terminal portion 682. The pad portion 681 and the terminal portion 682 are connected to each other.

Each of the pad portions 671 and 681 is covered by the resin member 8. Each of the pad portions 671 and 681 does not overlap with the insulating substrate 1 in a plan view. A plurality of connecting members 72 are joined to the pad portions 671 and 681. The connecting member 72 joined to the pad portion 671 is also joined to the obverse surface electrode 342 of the semiconductor element 34. Thus, the pad portion 671 is electrically connected to the obverse surface electrode 342 (source electrode) of the semiconductor element 34 via the connecting member 72. The connecting member 72 joined to the pad portion 681 is also joined to the obverse surface electrode 332 of the semiconductor element 33. Thus, the pad portion 681 is electrically connected to the obverse surface electrode 332 (source electrode) of the semiconductor element 33 via the connecting member 72.

Each of the terminal portions 672 and 682 is exposed from the resin member 8. Each of the terminal portions 672 and 682 is bent in the z2 direction. The terminal portions 672 and 682 are external terminals of the electronic device A3. The pad portion 671 is electrically connected to the obverse surface electrode 342 (source electrode) of the semiconductor element 34, and accordingly, a source current of the semiconductor element 34 flows through the terminal portion 672. Also, the pad portion 681 is electrically connected to the obverse surface electrode 332 (source electrode) of the semiconductor element 33, and accordingly, a source current of the semiconductor element 33 flows through the terminal portion 682.

As shown in FIGS. 14 and 15, among the lead frames 6 of the electronic device A3, the plurality of pad portions 611, 621, 651, and 661 are arranged in the following order in the x direction. That is, the pad portions are arranged in the order of the pad portion 611, the pad portion 621, the pad portion 651, and the pad portion 661 from the x2 side toward the x1 side. The plurality of pad portions 611, 621, 651, and 661 overlap with each other as viewed in the x direction.

Similarly to the first embodiment and the second embodiment, among the lead frames 6 of the electronic device A3, the pad portion 611 and the pad portion 621 are arranged in the x direction with the first separation region S1 sandwiched between the pad portions 611 and 621. The control unit 41 overlaps with the first separation region S1 as viewed in the y direction. In the present embodiment, the control unit 41 does not overlap with the first separation region S1 as viewed in the x direction, and is located on the side (y2 side) where there are the leads 69 in the y direction, with respect to the pad portions 611 and 621. In the present embodiment, the lead frames 6 are not located in the first separation region S1.

Among the lead frames 6 of the electronic device A3, the pad portion 651 and the pad portion 661 are arranged in the x direction with a second separation region S2 sandwiched between the pad portions 651 and 661. The second separation region S2 and the first separation region S1 are arranged in the x direction. The control unit 42 overlaps with the second separation region S2 as viewed in the y direction. In the present embodiment, the control unit 42 does not overlap with the second separation region S2 as viewed in the x direction, and is located on the side (y2 side) where there are the leads 69 in the y direction, with respect to the pad portions 651 and 661. In the present embodiment, the lead frames 6 are not located in the second separation region S2.

Similarly to the electronic devices A1 and A2, the electronic device A3 also includes the wiring portions 2 formed on the substrate obverse surface 11. The wiring portions 2 transmit control signals (e.g., driving signals) for controlling the semiconductor elements 31 to 34 and constitute transmission paths of the control signals. Therefore, with the electronic device A3, it is possible to make the transmission paths thin, increase the density of the transmission paths, and increase the integration density.

Similarly to the electronic devices A1 and A2, in the electronic device A3, the pad portion 611 to which the semiconductor element 31 is joined and the pad portion 621 to which the semiconductor element 32 is joined are arranged in the x direction with the first separation region S1 sandwiched between the pad portions 611 and 621. The control unit 41 that controls the semiconductor elements 31 and 32 overlaps with the first separation region S1 as viewed in the y direction. Therefore, similarly to the electronic device A1, the electronic device A3 can reduce a difference between a transmission time of the first driving signal that is input from the control unit 41 (control element 4c) to the semiconductor element 31 (control electrode 311) and a transmission time of the second driving signal that is input from the control unit 41 (control element 4c) to the semiconductor element 32 (control electrode 321).

In the electronic device A3, the pad portion 651 to which the semiconductor element 33 is joined and the pad portion 661 to which the semiconductor element 34 is joined are arranged in the x direction with the second separation region S2 sandwiched between the pad portions 651 and 661. The control unit 42 that controls the semiconductor elements 33 and 34 overlaps with the second separation region S2 as viewed in the y direction. Therefore, the electronic device A3 can reduce a difference between a transmission time of the third driving signal that is input from the control unit 42 (control element 4c) to the semiconductor element 33 (control electrode 331) and a transmission time of the fourth driving signal that is input from the control unit 42 (control element 4c) to the semiconductor element 34 (control electrode 341).

Figure 17:
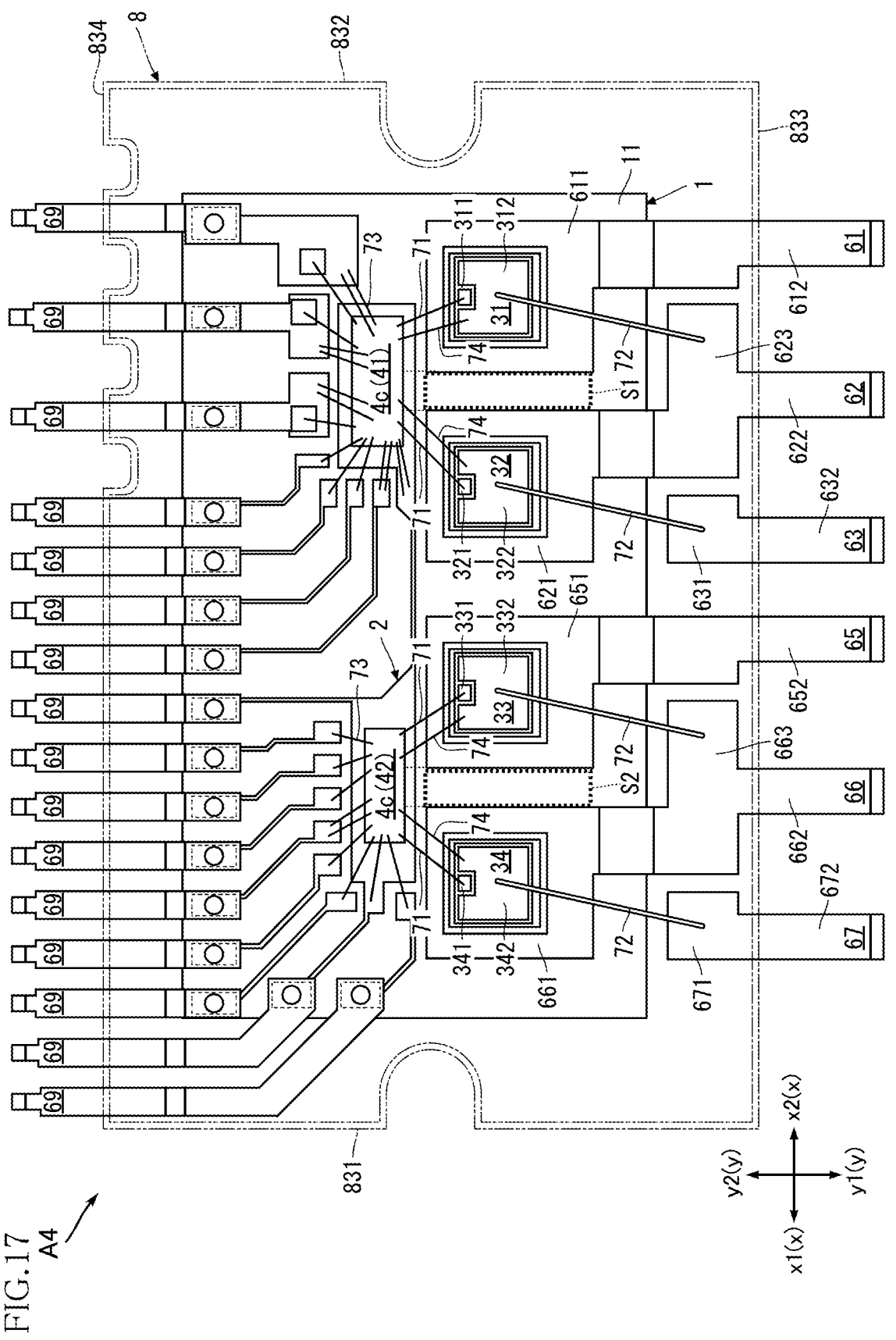
FIG. 17 is a plan view showing an electronic device according to a fourth embodiment, in which the resin member is shown using an imaginary line.
Figure 18:
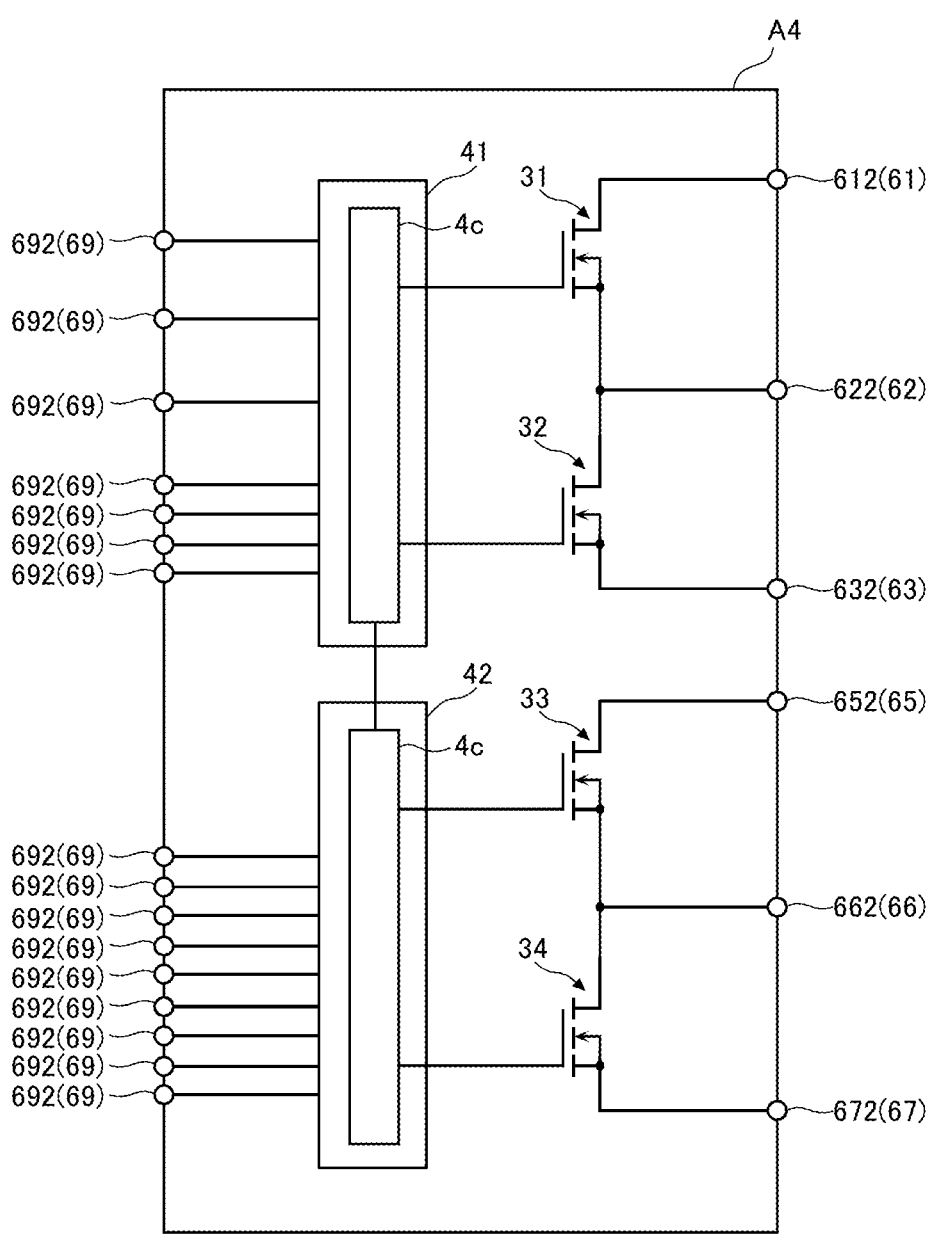
FIG. 18 is an example of a circuit diagram of the electronic device according to the fourth embodiment.

FIGS. 17 and 18 show an electronic device A4 according to a fourth embodiment. FIG. 17 is a plan view of the electronic device A4, in which the resin member 8 is shown using an imaginary line. FIG. 18 is a circuit diagram showing a circuit configuration of the electronic device A4.

Unlike the electronic device A3, in the electronic device A4, the two semiconductor elements 31 and 32 are electrically connected to each other and the two semiconductor elements 33 and 34 are electrically connected to each other inside the resin member 8 as shown in FIGS. 17 and 18. In the electronic device A4, the two semiconductor elements 31 and 32 are connected in series and constitute a leg with a configuration described below as shown in FIG. 18. In the leg, the semiconductor element 31 constitutes an upper arm circuit, and the semiconductor element 32 constitutes a lower arm circuit. Also, the two semiconductor elements 33 and 34 are connected in series and constitute a leg as shown in FIG. 18. In the leg, the semiconductor element 33 constitutes an upper arm circuit, and the semiconductor element 34 constitutes a lower arm circuit.

As shown in FIG. 17, in the electronic device A4, a connecting member 72 that is joined to the obverse surface electrode 312 of the semiconductor element 31 is joined to the lead 62 (pad portion 623), rather than the lead 64. Accordingly, the obverse surface electrode 312 of the semiconductor element 31 and the reverse surface electrode 323 of the semiconductor element 32 are electrically connected to each other via the connecting member 72 and the lead 62. Also, as shown in FIG. 17, in the electronic device A4, a connecting member 72 that is joined to the obverse surface electrode 332 of the semiconductor element 33 is joined to the lead 66 (pad portion 663, which will be described later). Accordingly, the obverse surface electrode 332 of the semiconductor element 33 and the reverse surface electrode 343 of the semiconductor element 34 are electrically connected to each other via the connecting member 72 and the lead 66.

Compared with the lead 66 of the electronic device A3, the lead 66 of the lead frames 6 further includes the pad portion 663. The pad portion 663 is connected to the pad portion 661 and the terminal portion 662. The connecting member 72 joined to the obverse surface electrode 332 of the semiconductor element 33 is joined to the pad portion 663.

Similarly to the electronic device A2, in the electronic device A4, the two leads 61 and 63 are input terminals for power supply voltage, and the lead 62 is an output terminal for AC power of which the voltage has been converted by the two semiconductor elements 31 and 32. Also, in the electronic device A4, for example, power supply voltage is applied between the two leads 65 and 67. The lead 65 is a positive electrode (P terminal) and the lead 67 is a negative electrode (N terminal). The power supply voltage input between the two leads 65 and 67 is converted to AC power (voltage) through switching operations of the two semiconductor elements 33 and 34. Then, the AC power is output from the lead 66. Accordingly, the two leads 65 and 67 are input terminals for the power supply voltage, and the lead 66 is an output terminal for AC power of which the voltage has been converted by the two semiconductor elements 33 and 34.

Similarly to the electronic device A3, the electronic device A4 also includes the wiring portions 2 formed on the substrate obverse surface 11. The wiring portions 2 transmit control signals (e.g., driving signals) for controlling the semiconductor elements 31 to 34 and constitute transmission paths of the control signals. Therefore, with the electronic device A4, it is possible to make the transmission paths thin, increase the density of the transmission paths, and increase the integration density.

Similarly to the electronic device A3, in the electronic device A4, the control unit 41 overlaps with the first separation region S1 as viewed in the y direction, and the control unit 42 overlaps with the second separation region S2 as viewed in the y direction. Therefore, similarly to the electronic device A3, the electronic device A4 can reduce a difference between a transmission time of the first driving signal and a transmission time of the second driving signal, and reduce a difference between a transmission time of the third driving signal and a transmission time of the fourth driving signal.

Figure 19:
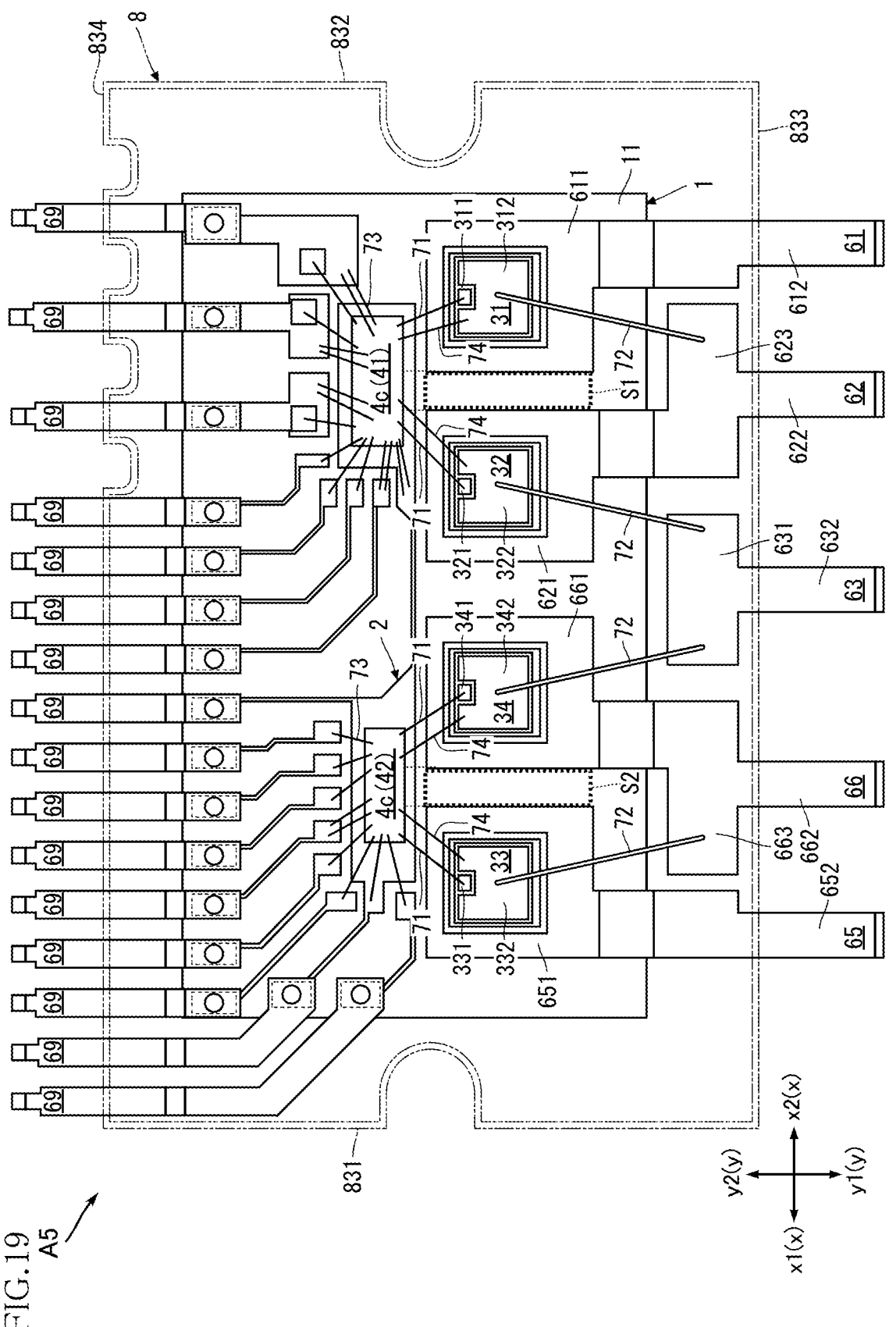
FIG. 19 is a plan view showing an electronic device according to a fifth embodiment, in which the resin member is shown using an imaginary line.
Figure 20:
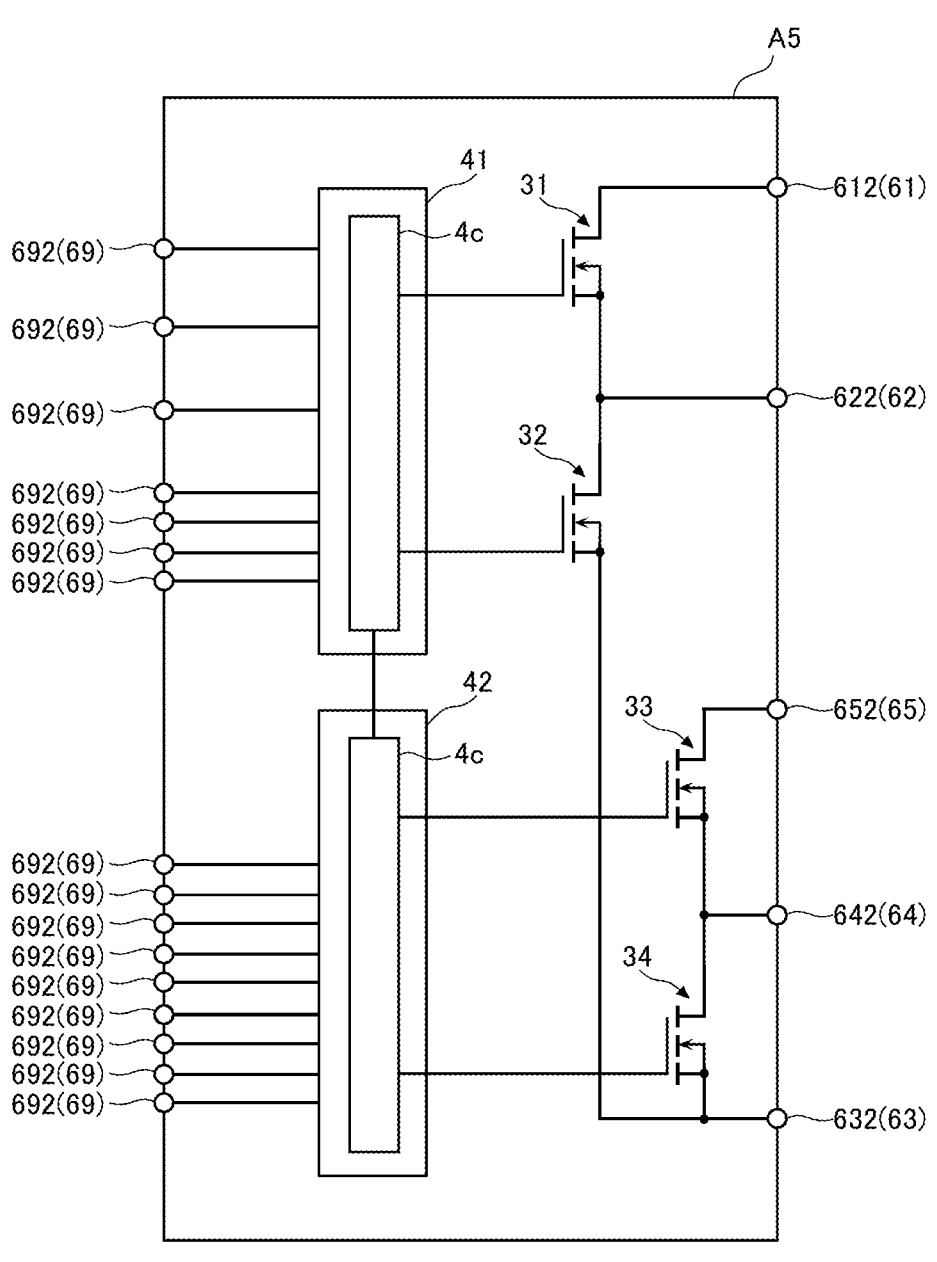
FIG. 20 is an example of a circuit diagram of the electronic device according to the fifth embodiment.

FIGS. 19 and 20 show an electronic device A5 according to a fifth embodiment. FIG. 19 is a plan view of the electronic device A5, in which the resin member 8 is shown using an imaginary line. FIG. 20 is a circuit diagram showing a circuit configuration of the electronic device A5.

As shown in FIG. 19, the electronic device A5 differs from the electronic device A4 in the arrangement of the four semiconductor elements 31 to 34. Accordingly, the configuration of the lead frames 6 is changed as appropriate.

In the electronic device A5, the four semiconductor elements 31 to 34 are arranged in the order of the semiconductor element 31, the semiconductor element 32, the semiconductor element 34, and the semiconductor element 33 from the x2 side toward the x1 side. Accordingly, the four pad portions 611, 621, 651, and 661 are arranged in the order of the pad portion 611, the pad portion 621, the pad portion 661, and the pad portion 651 from the x2 side toward the x1 side. Namely, the pad portion 621 and the pad portion 661 are adjacent to each other in the x direction.

The lead frames 6 of the electronic device A5 do not include the lead 67. Therefore, the connecting member 72 that is joined to the obverse surface electrode 342 of the semiconductor element 34 is joined to the pad portion 631 (lead 63). Accordingly, the obverse surface electrode 342 (semiconductor element 34) and the obverse surface electrode 322 (semiconductor element 32) are electrically connected to each other via two connecting members 72 and the lead 63. That is, as shown in FIG. 20, in the electronic device A5, the leg constituted by the two semiconductor elements 31 and 32 and the leg constituted by the two semiconductor elements 33 and 34 share a common negative terminal (N terminal).

Similarly to the electronic devices A3 and A4, the electronic device A5 also includes the wiring portions 2 formed on the substrate obverse surface 11. The wiring portions 2 transmit control signals (e.g., driving signals) for controlling the semiconductor elements 31 to 34 and constitute transmission paths of the control signals. Therefore, with the electronic device A5, it is possible to make the transmission paths thin, increase the density of the transmission paths, and increase the integration density.

Similarly to the electronic devices A3 and A4, in the electronic device A5, the control unit 41 overlaps with the first separation region S1 as viewed in the y direction, and the control unit 42 overlaps with the second separation region S2 as viewed in the y direction. Therefore, similarly to the electronic devices A3 and A4, the electronic device A5 can reduce a difference between a transmission time of the first driving signal and a transmission time of the second driving signal, and reduce a difference between a transmission time of the third driving signal and a transmission time of the fourth driving signal.

In the electronic device A5, the connecting member 72 joined to the obverse surface electrode 322 of the semiconductor element 32 and the connecting member 72 joined to the obverse surface electrode 342 of the semiconductor element 34 are joined to the pad portion 631 (lead 63). In this configuration, the lead 67 is integrated with the lead 63, and therefore, the lead 67 is unnecessary. That is, a common lead can serve as the lead 63 and the lead 67, and the number of external terminals of the electronic device A5 can be reduced.

Figure 21:
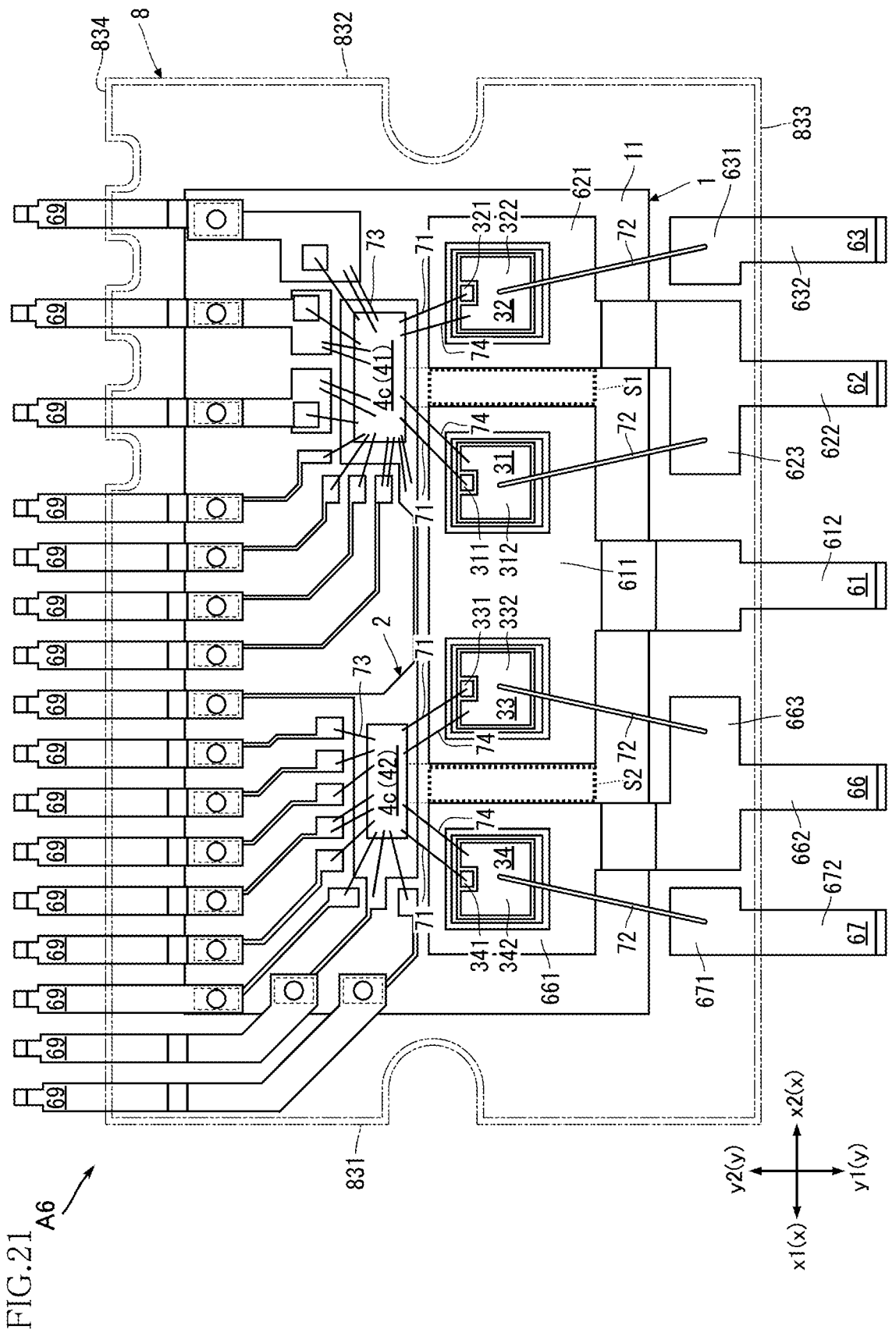
FIG. 21 is a plan view showing an electronic device according to a sixth embodiment, in which the resin member is shown using an imaginary line.
Figure 22:
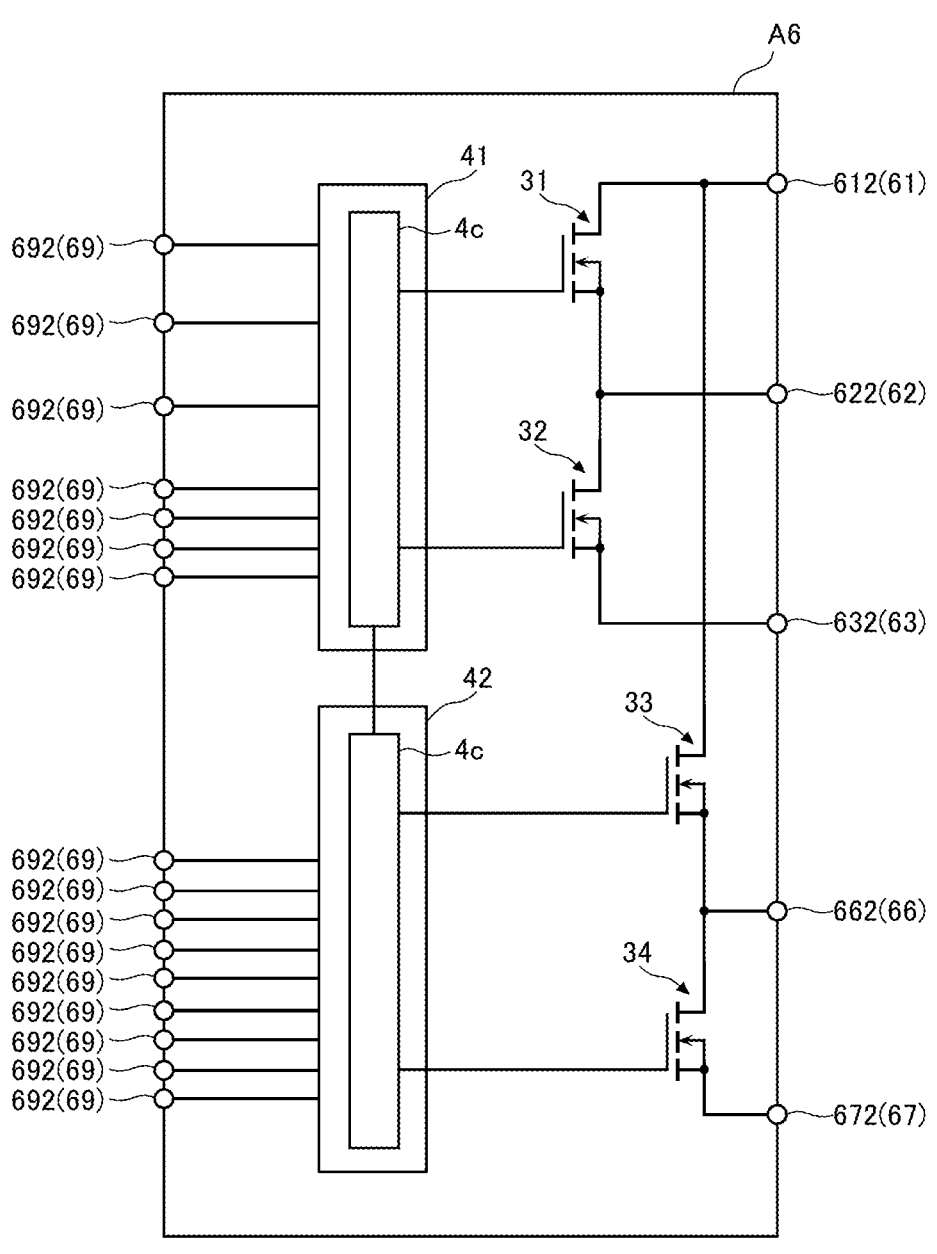
FIG. 22 is an example of a circuit diagram of the electronic device according to the sixth embodiment.

FIGS. 21 and 22 show an electronic device A6 according to a sixth embodiment. FIG. 21 is a plan view of the electronic device A6, in which the resin member 8 is shown using an imaginary line. FIG. 22 is a circuit diagram showing a circuit configuration of the electronic device A6.

As shown in FIG. 21, the electronic device A6 differs from the electronic devices A4 and A5 in the arrangement of the four semiconductor elements 31 to 34. Accordingly, the configuration of the lead frames 6 is changed as appropriate.

In the electronic device A6, the four semiconductor elements 31 to 34 are arranged in the order of the semiconductor element 32, the semiconductor element 31, the semiconductor element 33, and the semiconductor element 34 from the x2 side toward the x1 side.

In the electronic device A6, the lead frames 6 do not include the lead 65, and the semiconductor element 33 is mounted on the pad portion 611 (lead 61). The reverse surface electrode 333 of the semiconductor element 33 is joined and electrically connected to the pad portion 611. Accordingly, the reverse surface electrode 333 (semiconductor element 33) and the reverse surface electrode 313 (semiconductor element 31) are electrically connected to each other via the lead 61. That is, as shown in FIG. 22, in the electronic device A6, the leg constituted by the two semiconductor elements 31 and 32 and the leg constituted by the two semiconductor elements 33 and 34 share a common positive electrode (P terminal).

As shown in FIG. 21, the pad portion 611 is sandwiched between the pad portion 621 and the pad portion 661 in the x direction. The pad portion 611 and the pad portion 621 are arranged with the first separation region S1 sandwiched between the pad portions 611 and 621. The pad portion 611 and the pad portion 661 are arranged with the second separation region S2 sandwiched between the pad portions 611 and 661. The first separation region S1 and the second separation region S2 are arranged in the x direction.

Similarly to the electronic devices A3 to A5, the electronic device A6 also includes the wiring portions 2 formed on the substrate obverse surface 11. The wiring portions 2 transmit control signals (e.g., driving signals) for controlling the semiconductor elements 31 to 34 and constitute transmission paths of the control signals. Therefore, with the electronic device A6, it is possible to make the transmission paths thin, increase the density of the transmission paths, and increase the integration density.

Similarly to the electronic devices A3 and A5, in the electronic device A6, the control unit 41 overlaps with the first separation region S1 as viewed in the y direction, and the control unit 42 overlaps with the second separation region S2 as viewed in the y direction. Therefore, similarly to the electronic devices A3 to A5, the electronic device A6 can reduce a difference between a transmission time of the first driving signal and a transmission time of the second driving signal, and reduce a difference between a transmission time of the third driving signal and a transmission time of the fourth driving signal.

In the electronic device A6, the reverse surface electrode 313 of the semiconductor element 31 and the reverse surface electrode 333 of the semiconductor element 33 are joined to the pad portion 611 (lead 61). In this configuration, the lead 65 is integrated with the lead 61, and therefore, the lead 65 is unnecessary. That is, a common lead can serve as the lead 61 and the lead 65, and the number of external terminals of the electronic device A6 can be reduced.

In the third to sixth embodiments, examples in which the electronic devices A3 to A6 do not include the passive elements 5 are described, but the passive elements 5 (a thermistor 5a, a resistor 5b, a shunt resistor 5c, etc.) may be provided as appropriate according to specifications required for the electronic devices A3 to A6, for example.

In the third to sixth embodiments, examples in which the control unit 41 includes the control element 4c and the control element 4c controls operations of the two semiconductor elements 31 and 32 are described, but there is no limitation to these examples. For example, a control element that controls operations of the semiconductor element 31 and a control element that controls operations of the semiconductor element 32 may be provided separately from each other as the control unit 41 (see the first embodiment). Also, examples in which the control unit 42 includes the control element 4c and the control element 4c controls operations of the two semiconductor elements 33 and 34 are described, but there is no limitation to these examples. For example, a control element that controls operations of the semiconductor element 33 and a control element that controls operations of the semiconductor element 34 may be provided separately from each other as the control unit 42.

In the second to sixth embodiments, examples in which the control unit 41 does not overlap with the first separation region S1 as viewed in the x direction are described, but there is no limitation to these examples. For example, configurations (shapes, arrangement, etc.) of the wiring portions 2 and the lead frames 6 may be changed such that the entirety of the control unit 41 overlaps with the first separation region S1 as viewed in the x direction, similarly to the first embodiment, or a portion of the control unit 41 overlaps with the first separation region S1 as viewed in the x direction, similarly to the variation shown in FIG. 10. Similarly, in the third to sixth embodiments, examples in which the control unit 42 does not overlap with the second separation region S2 as viewed in the x direction are described, but there is no limitation to these examples. For example, configurations of the wiring portions 2 and the lead frames 6 may be changed such that the entirety of the control unit 42 overlaps with the second separation region S2 as viewed in the x direction, or a portion of the control unit 42 overlaps with the second separation region S2 as viewed in the x direction.

In the second to sixth embodiments, examples in which the electronic devices A2 to A6 do not include the protective elements 39A and 39B are described, but there is no limitation to these examples, and the protective elements 39A and 39B may be provided as necessary.

In the first to sixth embodiments, shapes and arrangement of the wiring portions 2 and shapes and arrangement of the lead frames 6 (leads 60 to 69) are not limited to the illustrated examples, and can be changed as appropriate according to required specifications, circuit configuration, or the like.

An electronic device according to the present disclosure is not limited to the embodiments described above. Various design changes can be made in specific configurations of portions of the electronic device according to the present disclosure. For example, an electronic device according to the present disclosure includes embodiments relating to the following clauses.

Clause 1

An electronic device comprising:

an insulating substrate that includes a substrate obverse surface facing one side in a thickness direction;

a wiring portion formed on the substrate obverse surface and made of a conductive material;

a lead frame arranged on the substrate obverse surface;

a first semiconductor element and a second semiconductor element that are electrically connected to the lead frame; and a first control unit that is electrically connected to the wiring portion and causes the first semiconductor element to operate as a first upper arm and causes the second semiconductor element to operate as a first lower arm, wherein the lead frame includes a first pad portion to which the first semiconductor element is joined and a second pad portion to which the second semiconductor element is joined, the first pad portion and the second pad portion are spaced apart from the wiring portion and are arranged in a first direction with a first separation region sandwiched between the first pad portion and the second pad portion, the first direction being orthogonal to the thickness direction, and the first control unit is spaced apart from the lead frame as viewed in the thickness direction and overlaps with the first separation region as viewed in a second direction that is orthogonal to the thickness direction and the first direction.

Clause 2

The electronic device according to Clause 1, wherein at least a portion of the first control unit overlaps with the first separation region as viewed in the first direction.

Clause 3

The electronic device according to Clause 1 or 2, wherein the first semiconductor element includes a first element obverse surface that faces the same direction as the substrate obverse surface and a first control electrode formed on the first element obverse surface, the second semiconductor element includes a second element obverse surface that faces the same direction as the substrate obverse surface and a second control electrode formed on the second element obverse surface, and the first control unit inputs a first driving signal for controlling driving of the first semiconductor element to the first control electrode and inputs a second driving signal for controlling driving of the second semiconductor element to the second control electrode.

Clause 4

The electronic device according to Clause 3, wherein the first control unit includes a first control element that outputs the first driving signal and a second control element that outputs the second driving signal.

Clause 5

The electronic device according to Clause 3 or 4, wherein the first semiconductor element includes a first element reverse surface that faces the first pad portion and a first reverse surface electrode formed on the first element reverse surface, the first reverse surface electrode is joined and electrically connected to the first pad portion, the second semiconductor element includes a second element reverse surface that faces the second pad portion and a second reverse surface electrode formed on the second element reverse surface, and the second reverse surface electrode is joined and electrically connected to the second pad portion.

Clause 6

The electronic device according to Clause 5, wherein the first semiconductor element further includes a first obverse surface electrode formed on the first element obverse surface, the first semiconductor element being configured to cause electricity to pass between the first reverse surface electrode and the first obverse surface electrode in accordance w the first driving signal, and the second semiconductor element further includes a second obverse surface electrode formed on the second element obverse surface, the second semiconductor element being configured to cause electricity to pass between the second reverse surface electrode and the second obverse surface electrode in accordance with the second driving signal.

Clause 7

The electronic device according to Clause 6, wherein the lead frame includes a first lead and a second lead that are spaced apart from each other, the first lead includes the first pad portion and a first terminal portion connected to the first pad portion, and the second lead includes the second pad portion and a second terminal portion connected to the second pad portion.

Clause 8

The electronic device according to Clause 7, wherein the lead frame further includes a third lead that is spaced apart from the first lead and the second lead, and the second obverse surface electrode is electrically connected to the third lead.

Clause 9

The electronic device according to Clause 8, wherein the first obverse surface electrode is electrically connected to the second lead.

Clause 10

The electronic device according to Clause 8, wherein the lead frame further includes a fourth lead that is spaced apart from the first lead, the second lead and the third lead, and the first obverse surface electrode is electrically connected to the fourth lead.

Clause 11

The electronic device according to any one of Clauses 8 to 10, further including a third semiconductor element and a fourth semiconductor element that are electrically connected to the lead frame, wherein the lead frames include a third pad portion to which the third semiconductor element is joined and a fourth pad portion to which the fourth semiconductor element is joined, and the third pad portion and the fourth pad portion are spaced apart from the wiring portions and are arranged in the first direction with a second separation region sandwiched between the third pad portion and the fourth pad portion.

Clause 12

The electronic device according to Clause 11, further including a second control unit that is electrically connected to the wiring portion and causes the third semiconductor element to operate as a second upper arm and causes the fourth semiconductor element to operate as a second lower arm, wherein the second control unit is spaced apart from the lead frames as viewed in the thickness direction, and overlaps with the second separation region as viewed in the second direction.

Clause 13

The electronic device according to Clause 12, wherein the first control unit and the second control unit are arranged in the first direction.

Clause 14

The electronic device according to Clause 12 or 13, wherein at least a portion of the second control unit overlaps with the second separation region as viewed in the first direction.

Clause 15

The electronic device according to any one of Clauses 12 to 14, wherein the third semiconductor element includes a third element obverse surface that faces the same direction as the substrate obverse surface and a third control electrode that is formed on the third element obverse surface, the fourth semiconductor element includes a fourth element obverse surface that faces the same direction as the substrate obverse surface and a fourth control electrode that is formed on the fourth element obverse surface, and the second control unit inputs a third driving signal for controlling driving of the third semiconductor element to the third control electrode and inputs a fourth driving signal for controlling driving of the fourth semiconductor element to the fourth control electrode.

Clause 16

The electronic device according to Clause 15, wherein the third semiconductor element includes a third element reverse surface that faces the third pad portion and a third reverse surface electrode formed on the third element reverse surface, the third reverse surface electrode is joined and electrically connected to the third pad portion, the fourth semiconductor element includes a fourth element reverse surface that faces the fourth pad portion and a fourth reverse surface electrode that is formed on the fourth element reverse surface, and the fourth reverse surface electrode is joined and electrically connected to the fourth pad portion.

Clause 17

The electronic device according to Clause 16, wherein the third semiconductor element further includes a third obverse surface electrode formed on the third element obverse surface, the third semiconductor element being configured to cause electricity to pass between the third reverse surface electrode and the third obverse surface electrode in accordance with the third driving signal, and the fourth semiconductor element further includes a fourth obverse surface electrode formed on the fourth element obverse surface, the fourth semiconductor element being configured to cause electricity to pass between the fourth reverse surface electrode and the fourth obverse surface electrode in accordance with the fourth driving signal.

Clause 18

The electronic device according to Clause 17, wherein the first pad portion, the second pad portion, the third pad portion, and the fourth pad portion are arranged in the first direction.

Clause 19

The electronic device according to Clause 18, wherein the second pad portion and the fourth pad portion of the lead frame are adjacent to each other in the first direction.

Clause 20

The electronic device according to Clause 19, wherein the fourth obverse surface electrode is electrically connected to the third lead.

Clause 21

The electronic device according to any one of Clauses 1 to 20, further including a resin member from which a portion of the lead frame is exposed and that covers at least a portion of the insulating substrate, the first semiconductor element, the second semiconductor element, the first control unit and the wiring portion.

Clause 22

The electronic device according to any one of Clauses 1 to 21, wherein the insulating substrate is made of a ceramic.

REFERENCE NUMERALS

A1 to A6: Electronic device
1: Insulating substrate
11: Substrate obverse surface
12: Substrate reverse surface
2: Wiring portion
21: Pad portion
22: Connection wire
31, 32, 33, 34: Semiconductor element
31a, 32a, 33a, 34a: Element obverse surface
31b, 32b, 33b, 34b: Element reverse surface
311, 321, 331, 341: Control electrode
312, 322, 332, 342: Obverse surface electrode
313, 323, 333, 343: Reverse surface electrode
39A, 39B: Protective element
391: Obverse surface electrode
392: Reverse surface electrode
41, 42: Control unit
4a, 4b, 4c: Control element
40: Control device
401: Resin package
402: Connection terminal
5: Passive element
5a: Thermistor
5b: Resistor
5c: Shunt resistor
6: Lead frame
60 to 69: Lead
601, 611, 621, 631, 641, 651, 661, 671, 681, 691: Pad portion
602, 612, 622, 632, 642, 652, 662, 672, 682, 692: Terminal portion
623, 663: Pad portion 71 to 75: Connecting member
8: Resin member
81: Resin obverse surface
82: Resin reverse surface
831 to 834: Resin side surface
S1: First separation region
S2: Second separation region

The invention claimed is:

1. An electronic device comprising:
an insulating substrate that includes a substrate obverse surface facing one side in a thickness direction;
a wiring portion formed on the substrate obverse surface and made of a conductive material;
a lead frame arranged on the substrate obverse surface;
a first semiconductor element and a second semiconductor element that are electrically connected to the lead frame; and
a first control unit that is electrically connected to the wiring portion and causes the first semiconductor element to operate as a first upper arm and causes the second semiconductor element to operate as a first lower arm,
wherein the lead frame includes a first pad portion to which the first semiconductor element is joined and a second pad portion to which the second semiconductor element is joined,
the first pad portion and the second pad portion are spaced apart from the wiring portion and are arranged in a first direction with a first separation region sandwiched between the first pad portion and the second pad portion, the first direction being orthogonal to the thickness direction,
the first control unit is spaced apart from the lead frame as viewed in the thickness direction and overlaps with the first separation region as viewed in a second direction that is orthogonal to the thickness direction and the first direction,
the first separation region is equal in length in the second direction to the first pad portion,
at least a portion of the first control unit overlaps with the first separation region as viewed in the first direction,
the first semiconductor element includes a first element obverse surface that faces the same direction as the substrate obverse surface and a first control electrode formed on the first element obverse surface,
the second semiconductor element includes a second element obverse surface that faces the same direction as the substrate obverse surface and a second control electrode formed on the second element obverse surface,
the first control unit inputs a first driving signal for controlling driving of the first semiconductor element to the first control electrode and inputs a second driving signal for controlling driving of the second semiconductor element to the second control electrode,
the first control unit includes a first control element that outputs the first driving signal and a second control element that outputs the second driving signal, and
the first control element and the second control element are spaced apart from each other as viewed in the thickness direction to be separately disposed on the wiring portion.

2. The electronic device according to claim 1, wherein the first semiconductor element includes a first element reverse surface that faces the first pad portion and a first reverse surface electrode formed on the first element reverse surface, the first reverse surface electrode is joined and electrically connected to the first pad portion,
the second semiconductor element includes a second element reverse surface that faces the second pad portion and a second reverse surface electrode formed on the second element reverse surface, and
the second reverse surface electrode is joined and electrically connected to the second pad portion.

3. The electronic device according to claim 2, wherein the first semiconductor element further includes a first obverse surface electrode formed on the first element obverse surface, the first semiconductor element being configured to cause electricity to pass between the first reverse surface electrode and the first obverse surface electrode in accordance with the first driving signal, and
the second semiconductor element further includes a second obverse surface electrode formed on the second element obverse surface, the second semiconductor element being configured to cause electricity to pass between the second reverse surface electrode and the second obverse surface electrode in accordance with the second driving signal.

4. The electronic device according to claim 3, wherein the lead frame includes a first lead and a second lead that are spaced apart from each other,
the first lead includes the first pad portion and a first terminal portion connected to the first pad portion, and
the second lead includes the second pad portion and a second terminal portion connected to the second pad portion.

5. The electronic device according to claim 4, wherein the lead frame further includes a third lead that is spaced apart from the first lead and the second lead, and
the second obverse surface electrode is electrically connected to the third lead.

6. The electronic device according to claim 5, wherein the first obverse surface electrode is electrically connected to the second lead.

7. The electronic device according to claim 5, wherein the lead frame further includes a fourth lead that is spaced apart from the first lead, the second lead and the third lead, and
the first obverse surface electrode is electrically connected to the fourth lead.

8. The electronic device according to claim 5, further including a third semiconductor element and a fourth semiconductor element that are electrically connected to the lead frame, wherein the lead frames include a third pad portion to which the third semiconductor element is joined and a fourth pad portion to which the fourth semiconductor element is joined, and
the third pad portion and the fourth pad portion are spaced apart from the wiring portions and are arranged in the first direction with a second separation region sandwiched between the third pad portion and the fourth pad portion.

9. The electronic device according to claim 1, further including a resin member from which a portion of the lead frame is exposed and that covers at least a portion of the insulating substrate, the first semiconductor element, the second semiconductor element, the first control unit and the wiring portion.

10. The electronic device according to claim 1, wherein the insulating substrate is made of a ceramic.

11. The electronic device according to claim 1, further comprising: a resin package covering the first control element; and a plurality of connection terminals connected to the first control element, wherein each of the connection terminals includes a portion exposed from the resin package and electrically bonded to the wiring portion.

12. The electronic device according to claim 11, wherein the second control element is spaced apart from the resin package.

13. An electronic device comprising:

an insulating substrate that includes a substrate obverse surface facing one side in a thickness direction;

a wiring portion formed on the substrate obverse surface and made of a conductive material;

a lead frame arranged on the substrate obverse surface;

a first semiconductor element and a second semiconductor element that are electrically connected to the lead frame; and a first control unit that is electrically connected to the wiring portion and causes the first semiconductor element to operate as a first upper arm and causes the second semiconductor element to operate as a first lower arm, wherein the lead frame includes a first pad portion to which the first semiconductor element is joined and a second pad portion to which the second semiconductor element is joined, the first pad portion and the second pad portion are spaced apart from the wiring portion and are arranged in a first direction with a first separation region sandwiched between the first pad portion and the second pad portion, the first direction being orthogonal to the thickness direction, the first control unit is spaced apart from the lead frame as viewed in the thickness direction and overlaps with the first separation region as viewed in a second direction that is orthogonal to the thickness direction and the first direction, the first separation region is equal in length in the second direction to the first pad portion, at least a portion of the first control unit overlaps with the first separation region as viewed in the first direction, the first semiconductor element includes a first element obverse surface that faces the same direction as the substrate obverse surface and a first control electrode formed on the first element obverse surface, the second semiconductor element includes a second element obverse surface that faces the same direction as the substrate obverse surface and a second control electrode formed on the second element obverse surface, the first control unit inputs a first driving signal for controlling driving of the first semiconductor element to the first control electrode and inputs a second driving signal for controlling driving of the second semiconductor element to the second control electrode, the first semiconductor element includes a first element reverse surface that faces the first pad portion and a first reverse surface electrode formed on the first element reverse surface, the first reverse surface electrode is joined and electrically connected to the first pad portion, the second semiconductor element includes a second element reverse surface that faces the second pad portion and a second reverse surface electrode formed on the second element reverse surface, the second reverse surface electrode is joined and electrically connected to the second pad portion, the first semiconductor element further includes a first obverse surface electrode formed on the first element obverse surface, the first semiconductor element being configured to cause electricity to pass between the first reverse surface electrode and the first obverse surface electrode in accordance with the first driving signal, the second semiconductor element further includes a second obverse surface electrode formed on the second element obverse surface, the second semiconductor element being configured to cause electricity to pass between the second reverse surface electrode and the second obverse surface electrode in accordance with the second driving signal, the lead frame includes a first lead and a second lead that are spaced apart from each other, the first lead includes the first pad portion and a first terminal portion connected to the first pad portion, the second lead includes the second pad portion and a second terminal portion connected to the second pad portion, the lead frame further includes a third lead that is spaced apart from the first lead and the second lead, the second obverse surface electrode is electrically connected to the third lead, the electronic device further including a third semiconductor element and a fourth semiconductor element that are electrically connected to the lead frame, wherein the lead frames include a third pad portion to which the third semiconductor element is joined and a fourth pad portion to which the fourth semiconductor element is joined, the third pad portion and the fourth pad portion are spaced apart from the wiring portions and are arranged in the first direction with a second separation region sandwiched between the third pad portion and the fourth pad portion, the electronic device further includes a second control unit that is electrically connected to the wiring portion and causes the third semiconductor element to operate as a second upper arm and causes the fourth semiconductor element to operate as a second lower arm, and the second control unit is spaced apart from the lead frames as viewed in the thickness direction, and overlaps with the second separation region as viewed in the second direction.

14. The electronic device according to claim 13, wherein the first control unit and the second control unit are arranged in the first direction.

15. The electronic device according to claim 13, wherein at least a portion of the second control unit overlaps with the second separation region as viewed in the first direction.

16. The electronic device according to claim 13, wherein the third semiconductor element includes a third element obverse surface that faces the same direction as the substrate obverse surface and a third control electrode that is formed on the third element obverse surface, the fourth semiconductor element includes a fourth element obverse surface that faces the same direction as the substrate obverse surface and a fourth control electrode that is formed on the fourth element obverse surface, and the second control unit inputs a third driving signal for controlling driving of the third semiconductor element to the third control electrode and inputs a fourth driving signal for controlling driving of the fourth semiconductor element to the fourth control electrode.

17. The electronic device according to claim 16, wherein the third semiconductor element includes a third element reverse surface that faces the third pad portion and a third reverse surface electrode formed on the third element reverse surface, the third reverse surface electrode is joined and electrically connected to the third pad portion, the fourth semiconductor element includes a fourth element reverse surface that faces the fourth pad portion and a fourth reverse surface electrode that is formed on the fourth element reverse surface, and the fourth reverse surface electrode is joined and electrically connected to the fourth pad portion.

18. The electronic device according to claim 17, wherein the third semiconductor element further includes a third obverse surface electrode formed on the third element obverse surface, the third semiconductor element being configured to cause electricity to pass between the third reverse surface electrode and the third obverse surface electrode in accordance with the third driving signal, and the fourth semiconductor element further includes a fourth obverse surface electrode formed on the fourth element obverse surface, the fourth semiconductor element being configured to cause electricity to pass between the fourth reverse surface electrode and the fourth obverse surface electrode in accordance with the fourth driving signal.

19. The electronic device according to claim 18, wherein the first pad portion, the second pad portion, the third pad portion, and the fourth pad portion are arranged in the first direction.

20. The electronic device according to claim 19, wherein the second pad portion and the fourth pad portion of the lead frame are adjacent to each other in the first direction.

21. The electronic device according to claim 20, wherein the fourth obverse surface electrode is electrically connected to the third lead.

\* \* \* \* \*